(12) United States Patent
Chou

(10) Patent No.: US 11,978,662 B2
(45) Date of Patent: May 7, 2024

(54) METHOD FOR PREPARING SEMICONDUCTOR DEVICE WITH AIR GAP

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/232,937

(22) Filed: Aug. 11, 2023

(65) Prior Publication Data

US 2023/0386903 A1 Nov. 30, 2023

Related U.S. Application Data

(60) Division of application No. 18/200,095, filed on May 22, 2023, which is a continuation-in-part of application No. 17/343,360, filed on Jun. 9, 2021, now Pat. No. 11,705,364, which is a division of application No. 16/561,562, filed on Sep. 5, 2019, now Pat. No. 11,114,334.

(51) Int. Cl.
*H01L 21/768* (2006.01)
*H01L 23/528* (2006.01)
*H01L 23/532* (2006.01)
*H10B 12/00* (2023.01)

(52) U.S. Cl.
CPC .... *H01L 21/7682* (2013.01); *H01L 21/76837* (2013.01); *H01L 21/76877* (2013.01); *H01L 23/528* (2013.01); *H01L 23/5329* (2013.01); *H10B 12/315* (2023.02); *H10B 12/482* (2023.02); *H10B 12/485* (2023.02); *H10B 12/34* (2023.02)

(58) Field of Classification Search
None
See application file for complete search history.

(56) References Cited

U.S. PATENT DOCUMENTS

| | | | |
|---|---|---|---|
| 10,043,809 B1 * | 8/2018 | Chang | H10B 12/482 |
| 2010/0025775 A1 * | 2/2010 | Giles | H01L 29/4966 257/E21.409 |
| 2010/0285662 A1 * | 11/2010 | Kim | H10B 12/315 257/E21.585 |

(Continued)

*Primary Examiner* — Evren Seven
(74) *Attorney, Agent, or Firm* — Xuan Zhang

(57) ABSTRACT

A method for preparing a semiconductor device, includes: forming a first dielectric structure and a second dielectric structure over a semiconductor substrate; forming a conductive material over the first dielectric structure and the second dielectric structure, wherein the conductive material extends into a first opening between the first dielectric structure and the second dielectric structure; partially removing the conductive material to form a first bit line and a second bit line in the first opening; forming a first capacitor contact and a second capacitor contact in the first dielectric structure and the second dielectric structure, respectively; forming a sealing dielectric layer over the first bit line and the second bit line such that an air gap is formed between the sealing dielectric layer and the semiconductor substrate; and forming a first capacitor and a second capacitor over the first capacitor contact and the second capacitor contact, respectively.

19 Claims, 18 Drawing Sheets

(56) References Cited

U.S. PATENT DOCUMENTS

2012/0168899 A1* 7/2012 Kim .................. H01L 21/76897
  438/586
2014/0306351 A1* 10/2014 Kim .................. H01L 21/76831
  438/653

* cited by examiner

METHOD FOR PREPARING SEMICONDUCTOR DEVICE WITH AIR GAP

CROSS-REFERENCE TO RELATED APPLICATION

This application is a divisional application of U.S. Non-Provisional application Ser. No. 18/200,095 filed May 22, 2023, which a continuation-in-part application of U.S. Non-Provisional application Ser. No. 17/343,360 filed Jun. 9, 2021, which is a divisional application of U.S. Non-Provisional application Ser. No. 16/561,562 filed Sep. 5, 2019. Those are incorporated herein by reference in their entireties.

TECHNICAL FIELD

The present disclosure relates to a method for preparing a semiconductor device, and more particularly, to a method for preparing a semiconductor device with air gaps between conductive lines (e.g., bit lines).

DISCUSSION OF THE BACKGROUND

Due to structural simplicity, dynamic random access memories (DRAMs) can provide more memory cells per unit chip area than other types of memories, such as static random access memories (SRAMs). A DRAM is comprised of a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have been continuously reduced so that the packing densities of such DRAMs have increased considerably. However, as DRAM memory cell dimension requirements are dictating decreased sizes, capacitive coupling, which results in increased parasitic capacitance, is becoming an increasingly important issue. Accordingly, the speeds of DRAM memory cells are undesirably reduced and the overall device performance is being negatively impacted.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device is provided. The method includes: forming a first dielectric structure and a second dielectric structure over a semiconductor substrate; forming a conductive material over the first dielectric structure and the second dielectric structure, wherein the conductive material extends into a first opening between the first dielectric structure and the second dielectric structure; partially removing the conductive material to form a first bit line and a second bit line in the first opening; forming a first capacitor contact and a second capacitor contact in the first dielectric structure and the second dielectric structure, respectively; forming a sealing dielectric layer over the first bit line and the second bit line such that an air gap is formed between the sealing dielectric layer and the semiconductor substrate; and forming a first capacitor and a second capacitor over the first capacitor contact and the second capacitor contact, respectively.

In some embodiments, a top surface of the semiconductor substrate between the first bit line and the second bit line is exposed after the partial removal of the conductive material.

In some embodiments, the first bit line is in direct contact with the first dielectric structure, and the second bit line is in direct contact with the second dielectric structure.

In some embodiments, the first bit line and the second bit line are separated by a second opening, and the sealing dielectric layer extends into a top portion of the second opening to form the air gap.

In some embodiments, the method further includes forming a first bit line contact and a second bit line contact in the semiconductor substrate. The first bit line contact and the second bit line contact are between the first dielectric structure and the second dielectric structure.

In some embodiments, a portion of the conductive material between the first bit line contact and the second bit line contact is removed during the partial removal of the conductive material.

In some embodiments, a recess surrounded by the conductive material is formed before the conductive material is partially removed, and the recess is between the first bit line contact and the second bit line contact.

In some embodiments, a bottom surface of the recess is higher than a top surface of the semiconductor substrate.

In some embodiments, the step of forming the first capacitor contact and the second capacitor contact in the first dielectric structure and the second dielectric structure includes: etching the first dielectric structure to form a recess; comformally forming a contact layer of the first capacitor in the recess; depositing a conductive column of the first capacitor contact over the contact layer; forming a first conductive layer and a second conductive layer over the first conductive layer; performing a first etching process to remove a portion of the second conductive layer to form a landing pad of the first capacitor contact; and performing a second etching process to remove a portion of the first conductive layer to form a conductive pillar of the first capacitor contact.

In some embodiments, the first etching process is an anisotropic etching process, and the second etching process is an isotropic etching process.

In some embodiments, the first etching process and the second etching process are the same.

In some embodiments, the first etching process and the second etching process are an anisotropic etching process.

In some embodiments, a width of the conductive pillar is narrower than a width of the landing pad.

In some embodiments, the method further includes forming isolation structures, a first active region, a second active region, and a word line in the semiconductor substrate.

In some embodiments, the first active region and the second active region are separated by one of the isolation structures, the first capacitor contact is in contact with the first active region, and the second capacitor contact is in contact with the second active region.

In some embodiments, forming the isolation structures, the first active region, the second active region, and the word line in the semiconductor substrate includes: forming a gate dielectric layer; forming a buried gate electrode; and forming an insulating capping layer. The gate dielectric layer is disposed between the buried gate electrode and the semiconductor substrate, and the buried gate electrode is disposed between the gate dielectric layer and the insulating capping layer.

In another embodiment of the present disclosure, a semiconductor device is provided. The semiconductor device includes a first bit line, a dielectric structure, a second bit line, a sealing dielectric layer, a capacitor contact, and a capacitor. The first bit line is disposed over a semiconductor substrate. The dielectric structure is disposed over a sidewall of the first bit line. The second bit line is disposed over the semiconductor substrate. The first bit line is between the second bit line and the dielectric structure, and the first bit line is separated from the second bit line by an air gap. The sealing dielectric layer is disposed over the first bit line, the second bit line, the dielectric structure and the air gap. The capacitor contact is disposed in the dielectric structure and the sealing dielectric layer. The capacitor is coupled to the capacitor contact.

In some embodiments, a top portion of the first bit line has a rounded corner, and a portion of the air gap extends between the sealing dielectric layer and the rounded corner of the first bit line.

In some embodiments, the capacitor contact includes a contact layer, a conductive column, and a landing pad. The contact layer is disposed in the dielectric structure. The conductive column, disposed in the dielectric structure. The contact layer is disposed between the dielectric structure and the conductive column. The conductive pillar is disposed over the contact layer and the conductive column. The landing pad is disposed between the conductive pillar and the capacitor.

In some embodiments, a width of the capacitor is wider than a width of the landing pad.

In some embodiments, a width of the conductive pillar is narrower than a width of the landing pad.

In some embodiments, a width of the conductive pillar is substantially equal to a width of the landing pad.

In some embodiments, a width of the conductive pillar is wider than a width of a topmost surface of the contact layer.

In some embodiments, the dielectric structure is in direct contact with the sidewall of the first bit line.

In some embodiments, a top surface of the first bit line is higher than a top surface of the air gap.

In some embodiments, a top surface of the dielectric structure is higher than the top surface of the air gap.

In some embodiments, the semiconductor device further includes active regions defined by isolation structures in the semiconductor substrate.

In some embodiments, the semiconductor device further includes a first bit line contact and a second bit line contact disposed in the active regions. The first bit line is electrically connected to one of the active region by the first bit line contact, and the second bit line is electrically connected to another active region by the second bit line contact.

In some embodiments, the first bit line contact comprises a conductive layer and a metal silicide layer over the conductive layer.

In some embodiments, the semiconductor device further includes a word line, disposed in one of the active regions, wherein the word line is insulated from the first bit line and the second bit line.

In some embodiments, the word line is intersected with active regions and isolation structures.

In some embodiments, the word line includes a buried gate electrode, a gate dielectric layer, and an insulating capping layer. The gate dielectric layer is disposed between the active region and the buried gate electrode. The insulating capping layer is disposed over the gate dielectric layer.

In some embodiments, the sealing dielectric layer has a protruding portion sandwiched between the first bit line and the second bit line.

In some embodiments, the protruding portion of the sealing dielectric layer has a tip pointing toward the semiconductor substrate.

In some embodiments, an interface between the first bit line and the dielectric structure has a first height, an interface between the first bit line and the air gap has a second height, and the first height is greater than the second height.

Embodiments of a semiconductor device are provided in accordance with some embodiments of the disclosure. The semiconductor device includes a first bit line, a second bit line and a dielectric structure. The first bit line is between the second bit line and the dielectric structure, and the first bit line is separated from the second bit line by an air gap. Therefore, the parasitic capacitance between the first bit line and the second bit line may be reduced by the air gap having low dielectric constant, and the speeds of the semiconductor device may be increased. In addition, the first bit line may be prevented from collapsing due to the structural support provided by the dielectric structure, resulting in an improvement of the overall device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
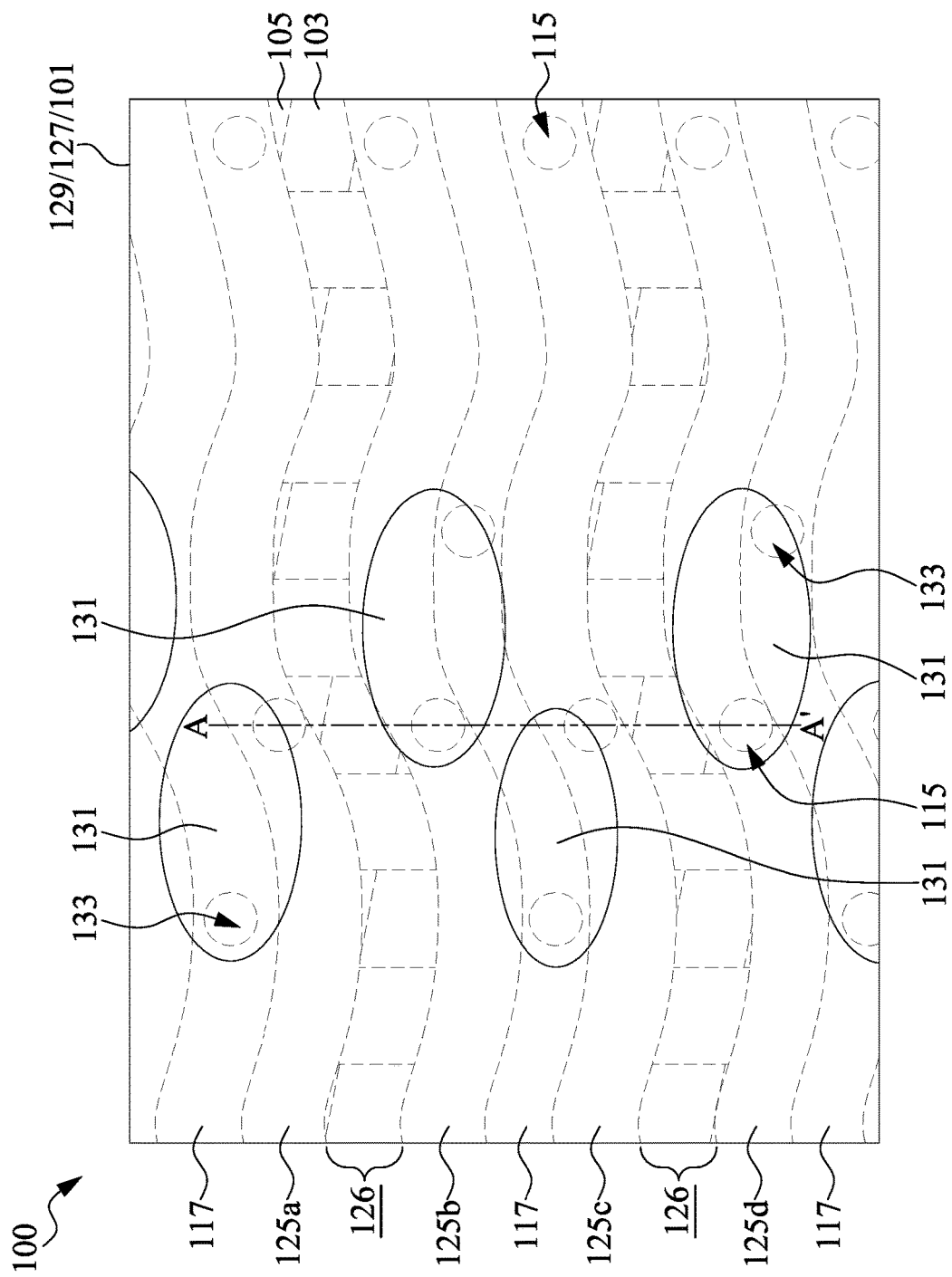
FIG. 1 is a top view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
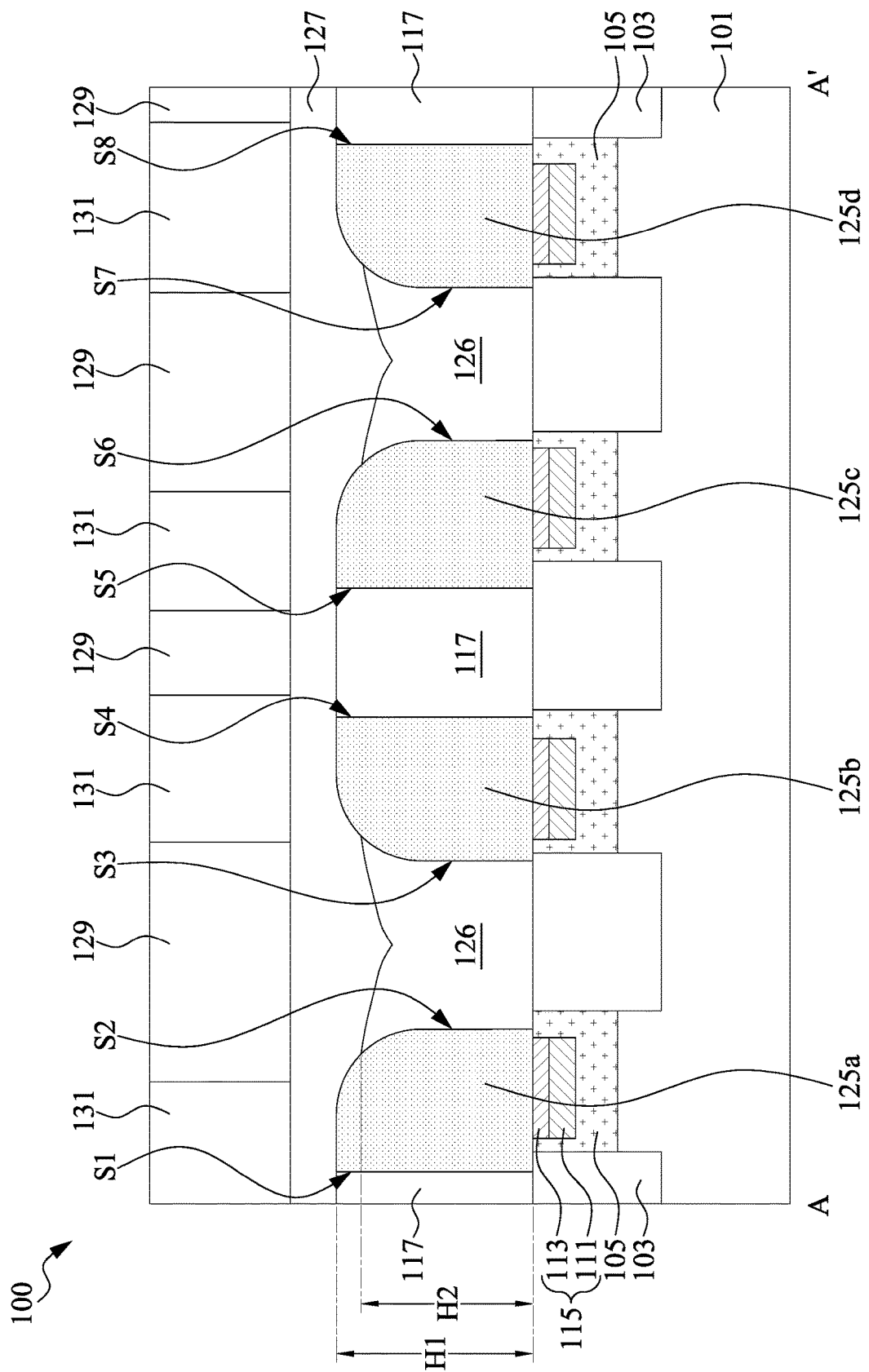
FIG. 2 is a cross-sectional view illustrating the semiconductor device along a sectional line A-A' in FIG. 1, in accordance with some embodiments.

FIG. 1 is a top view illustrating a semiconductor device 100, and FIG. 2 is a cross-sectional view illustrating the semiconductor device 100 along the sectional line A-A' in FIG. 1, in accordance with some embodiments. The semiconductor device 100 includes a plurality of bit lines 125a, 125b, 125c and 125d, a plurality of dielectric structures 117, and a plurality of air gaps 126 disposed over a semiconductor substrate 101, as shown in FIGS. 1 and 2 in accordance with some embodiments. It should be noted that the dielectric structures 117 and the air gaps 126 are alternately interposed between the bit lines 125a, 125b, 125c and 125d.

Figure 4:
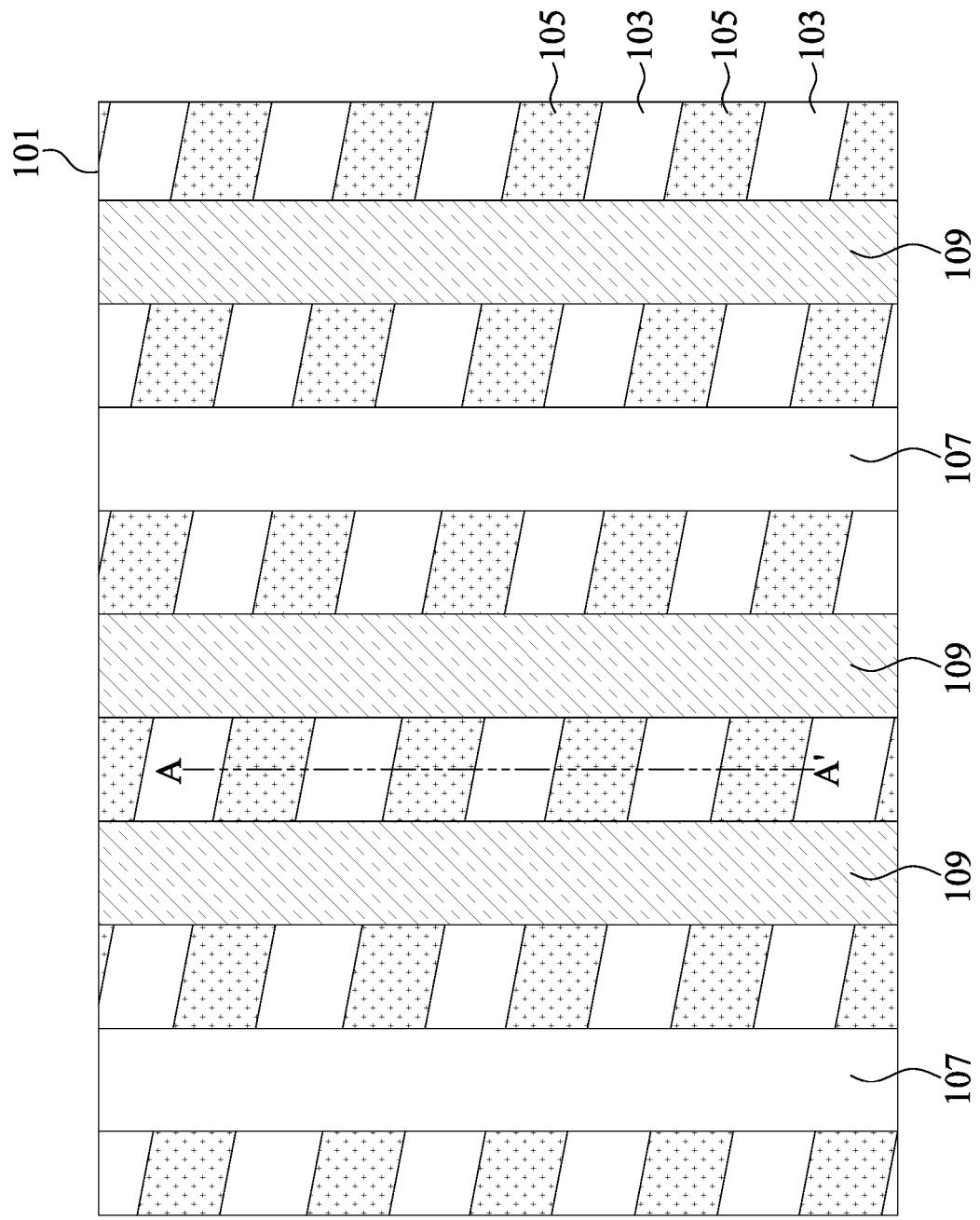
FIG. 4 is a top view illustrating one of the intermediate stages in the formation of a semiconductor device, in accordance with some embodiments.

In some embodiments, the bit lines 125a, 125b, 125c and 125d are electrically connected to a plurality of active regions 105 in the semiconductor substrate 101 by a plurality of bit line contacts 115 under the bit lines 125a, 125b, 125c and 125d. The active regions 105 are defined by a plurality of isolation structures 103 in the semiconductor substrate 101, and the active regions 105 include source/drain (S/D) regions. (A detailed layout of the isolation structures 103 and the active regions 105 is shown in FIG. 4.) The S/D regions may have a conductivity type (e.g., N-type) different from that of the semiconductor substrate 101.

In addition, the bit lines 125a, 125b, 125c and 125d, the dielectric structures 117 and the air gaps 126 are covered by a sealing dielectric layer 127, an inter-layer dielectric (ILD) structure 129 is disposed over the sealing dielectric layer 127, and a plurality of capacitors 131 are disposed in the ILD structure 129, as shown in FIGS. 1 and 2 in accordance with some embodiments. The capacitors 131 are electrically connected to the active regions 105 in the semiconductor substrate 101 by a plurality of capacitor contacts 133 as shown in FIG. 1 in accordance with some embodiments.

Although the bit lines 125a, 125b, 125c, 125d and the dielectric structures 117 are formed as wavy lines as illustrated in FIG. 1 in accordance with some embodiments, the present disclosure is not limited thereto. The shapes of the bit lines 125a, 125b, 125c, 125d and the dielectric structures 117 may be changed according to actual application. In addition, the semiconductor device 100 also includes a plurality of word lines 109 and a plurality of isolation lines 107, and the word lines 109 and the bit lines 125a, 125b, 125c, 125d are arranged so as to intersect each other. The layouts of the word lines 109 and the isolation lines 107 are shown in FIG. 4 and will be described later. In some embodiments, the semiconductor device 100 is a dynamic random access memory (DRAM).

Figure 3:
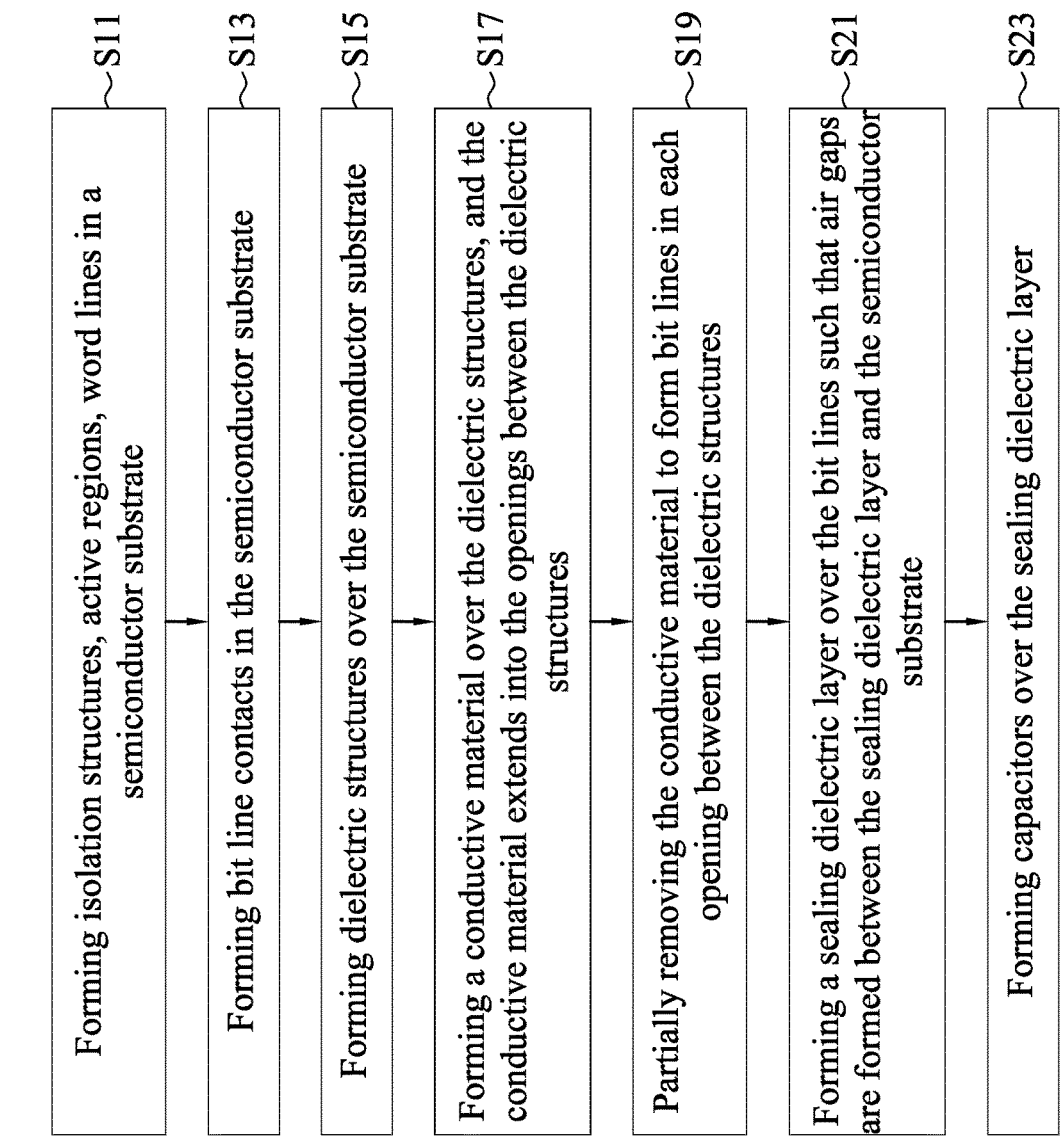
FIG. 3 is a flow diagram illustrating a method of preparing a semiconductor device, in accordance with some embodiments.

FIG. 3 is a flow diagram illustrating a method 10 of forming the semiconductor device 100 in accordance with some embodiments, and the method 10 includes steps S11, S13, S15, S17, S19, S21 and S23, in accordance with some embodiments. The steps S11 to S23 of FIG. 3 are elaborated in connection with FIGS. 1, 2 and 4 to 15.

Figure 5:
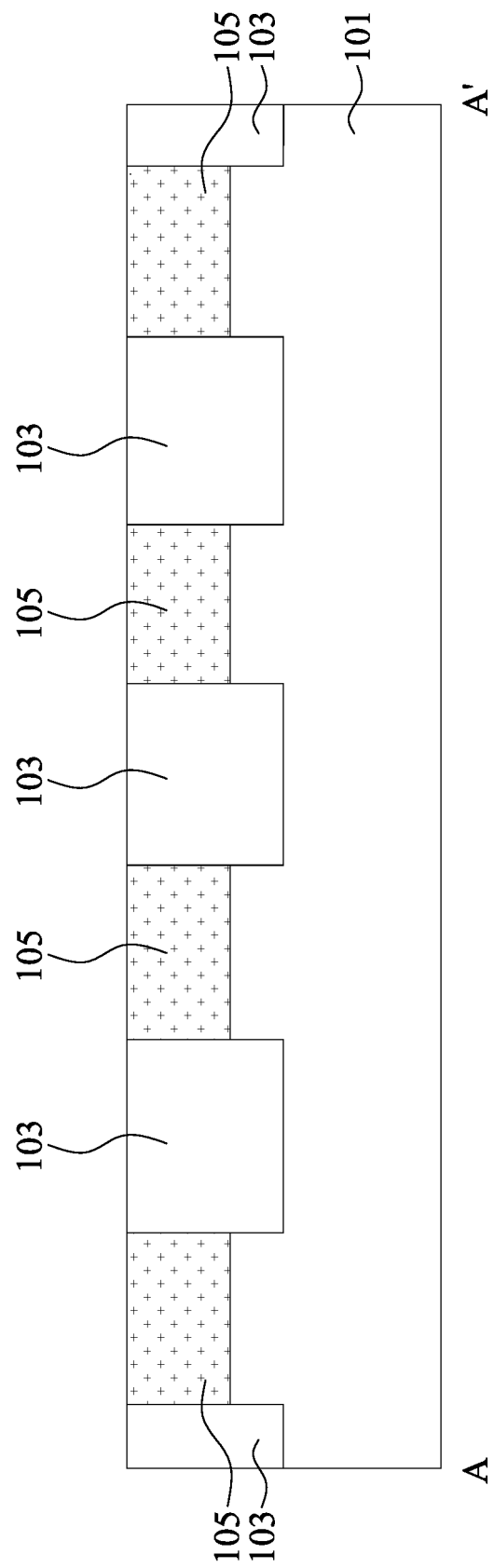
FIG. 5 is a cross-sectional view illustrating one of the intermediate stages in the formation of the semiconductor device along the sectional line A-A' in FIG. 4, in accordance with some embodiments.

FIG. 4 is a top view illustrating one of the intermediate stages in the formation of the semiconductor device 100, and FIG. 5 is a cross-sectional view illustrating one of the intermediate stages in the formation of the semiconductor device 100 along the sectional line A-A' in FIG. 4, in accordance with some embodiments.

As shown in FIGS. 4 and 5, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIGS. 4 and 5, the isolation structures 103 are formed in the semiconductor substrate 101, and the isolation structures 103 are shallow trench isolation (STI) structures, in accordance with some embodiments. In some other embodiments, the isolation structures 103 are local oxidation of silicon (LOCOS) structures (not shown). In such cases, portions of the isolation structures 103 are embedded in the semiconductor substrate 101, and other portions of the isolation structures 103 protrude from the top surface of the semiconductor substrate 101. In addition, the isolation structures 103 may be made of silicon oxide, silicon nitride, silicon oxynitride or another applicable dielectric material.

Moreover, the isolation structures 103 define the active regions 105 in the semiconductor substrate 101, and the active regions 105 include S/D regions. In some embodiments, the S/D regions of the active regions 105 are formed by one or more ion implantation processes, and P-type dopants, such as boron (B) or BF2, or N-type dopants, such as phosphorous (P) or arsenic (As), can be implanted in the active regions 105 to form the S/D regions.

Next, the word lines 109 and the isolation lines 107 are formed in the semiconductor substrate 101, as shown in FIGS. 4 and 5 in accordance with some embodiments. The respective step is illustrated as the step S11 in the method 10 shown in FIG. 3. In some embodiments, each of the word lines 109 includes a buried gate electrode (not shown). In some embodiments, each of the word lines 109 also includes a gate dielectric layer (not shown) between the buried gate electrode and the semiconductor substrate 101.

In some embodiments, the buried gate electrodes are made of a conductive material such as aluminum (Al), copper (Cu), tungsten (W), titanium (Ti), tantalum (Ta), or another applicable material, and the gate dielectric layers are made of silicon oxide, silicon nitride, silicon oxynitride, a dielectric material with high dielectric constant (high-k), or a combination thereof.

In addition, the isolation lines 107 may be used for isolating groups of transistors belonging to the same active region 105 from each other, and the isolation lines 107 may be arranged parallel to the word lines 107. In some embodiments, the isolation lines 107 are made of silicon oxide, silicon nitride, silicon oxynitride, a combination thereof, or another applicable material. Moreover, each of the isolation lines 107 may include a single layer or multiple layers.

In some embodiments, the word lines 109 are formed by etching and deposition processes. First, trenches are formed in the semiconductor substrate 101 by an etching process. The etching process may include a dry etching process or a wet etching process. After the trenches are formed, one or more deposition processes may be performed to form the word lines 109 in the trenches, and the deposition process may include a chemical vapor deposition (CVD) process, a physical vapor deposition (PVD) process, a spin coating process, or another applicable process.

After performing the deposition process(es), a planarization process, such as chemical mechanical polishing (CMP), may be performed such that the top surfaces of the word lines 109 are coplanar with the top surface of the semiconductor substrate 101. Some processes used to form the isolation lines 107 are similar to, or the same as, the processes used for forming the word lines 109, and descriptions thereof are not repeated herein. In some embodiments, the word lines 109 and the isolation lines 107 are independently formed. For example, in some embodiments, the isolation lines 107 are formed before the word lines 109.

Figure 6:
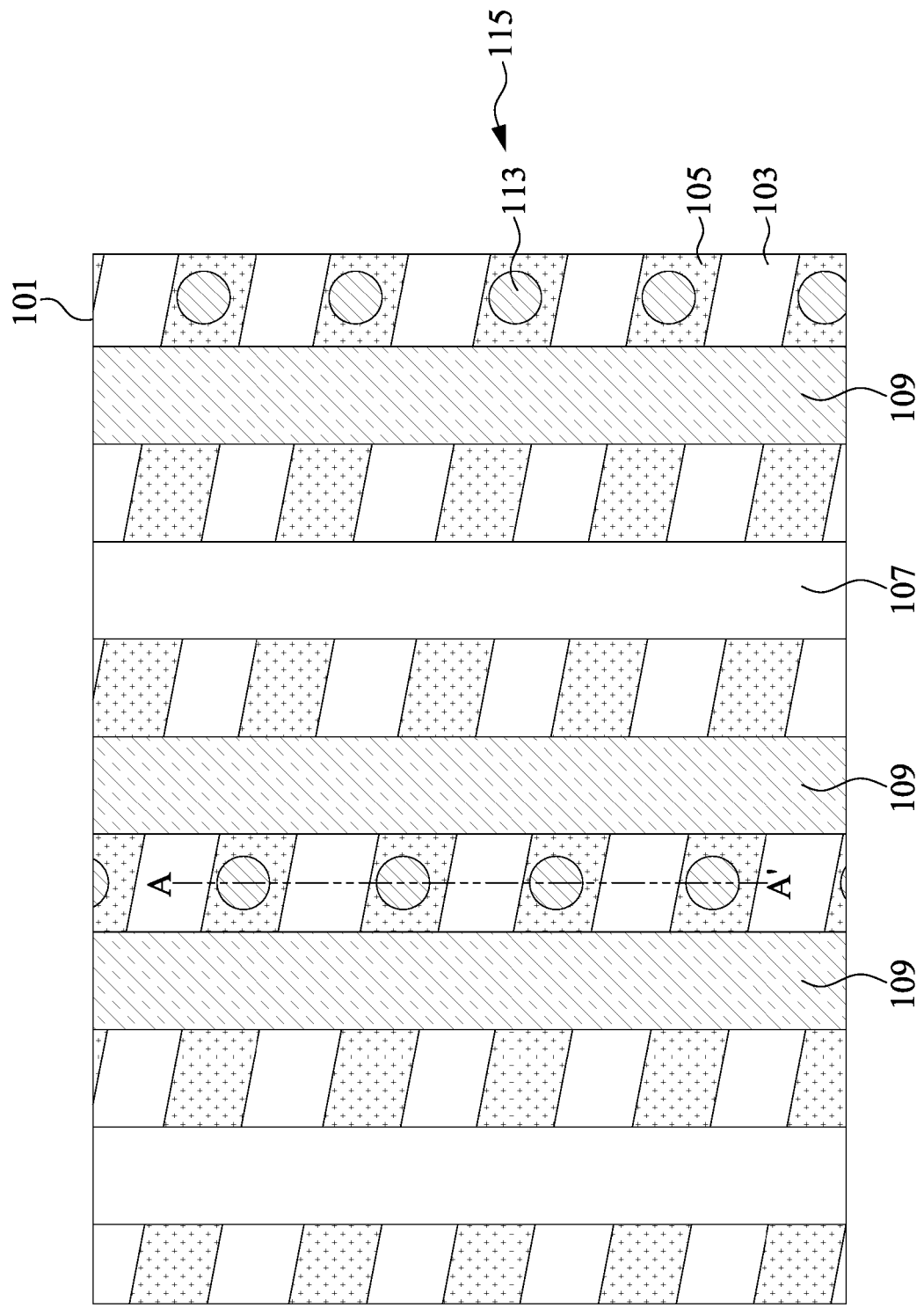
FIG. 6 is a top view illustrating one of the intermediate stages in the formation of a semiconductor device, in accordance with some embodiments.
Figure 7:
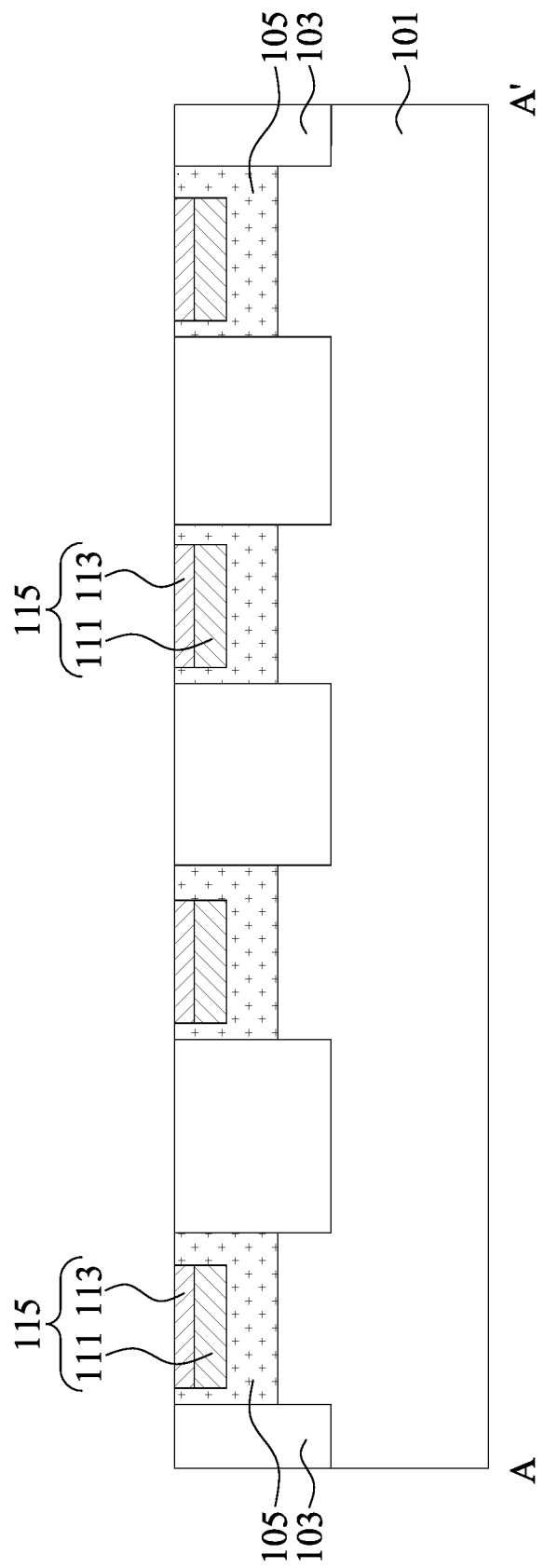
FIG. 7 is a cross-sectional view illustrating one of the intermediate stages in the formation of the semiconductor device along the sectional line A-A' in FIG. 6, in accordance with some embodiments.

FIG. 6 is a top view illustrating one of the intermediate stages in the formation of the semiconductor device 100, and FIG. 7 is a cross-sectional view illustrating one of the intermediate stages in the formation of the semiconductor device 100 along the sectional line A-A' in FIG. 6, in accordance with some embodiments.

After the word lines 107 are formed, the bit line contacts 115 are formed in the semiconductor substrate 101, as shown in FIGS. 6 and 7 in accordance with some embodiments. The respective step is illustrated as the step S13 in the method 10 shown in FIG. 3. More specifically, the bit line contacts 115 are formed in the S/D regions of the active regions 105.

In some embodiments, each of the bit line contacts 115 includes a conductive layer 111 and a metal silicide layer 113 over the conductive layer 111. In some embodiments, the conductive layers 111 are made of poly-crystalline silicon, tungsten (W), aluminum (Al), copper (Cu), nickel (Ni), cobalt (Co), another conductive material, or a combination thereof, and the metal silicide layers 113 are made of cobalt silicide, titanium silicide, tantalum silicide, nickel silicide, copper silicide, tungsten silicide, molybdenum silicide, another applicable metal silicide, or a combination thereof.

In some embodiments, the bit line contacts 115 are formed by etching and deposition processes. Some processes used to form the bit line contacts 115 are similar to, or the same as, the processes used for forming the word lines 109, and are not repeated herein. In some embodiments, the metal silicide layers 113 are formed by depositing a metal material (e.g., cobalt) over the conductive layers 111, and performing a thermal treatment on the metal material to form the metal silicide layers 113 (e.g., cobalt silicide) from the metal material. After the thermal treatment process is performed, a planarization process, such as chemical mechanical polishing (CMP), may be performed such that the top surfaces of the bit line contacts 115 are coplanar with the top surface of the semiconductor substrate 101.

Figure 8:
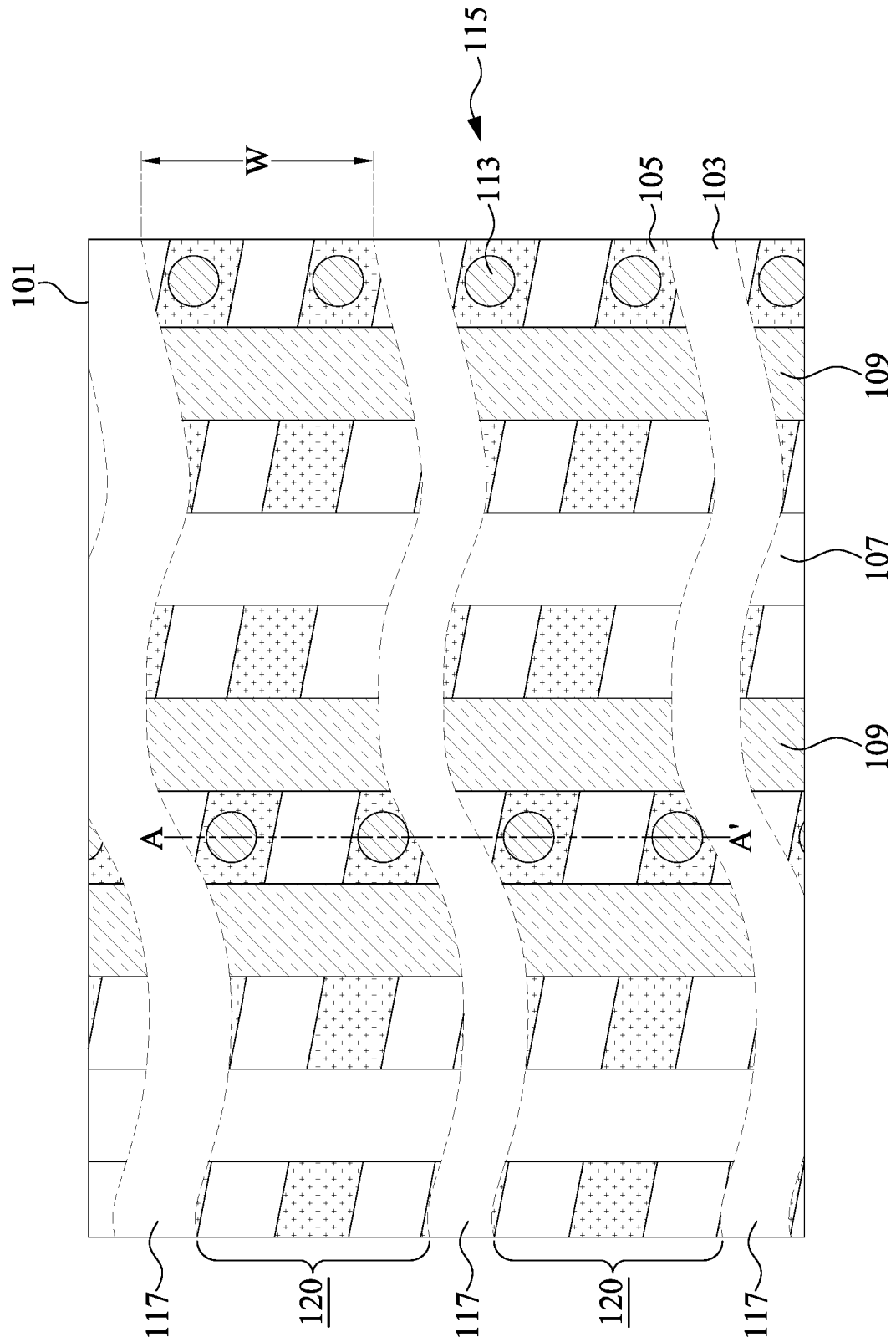
FIG. 8 is a top view illustrating one of the intermediate stages in the formation of a semiconductor device, in accordance with some embodiments.
Figure 9:
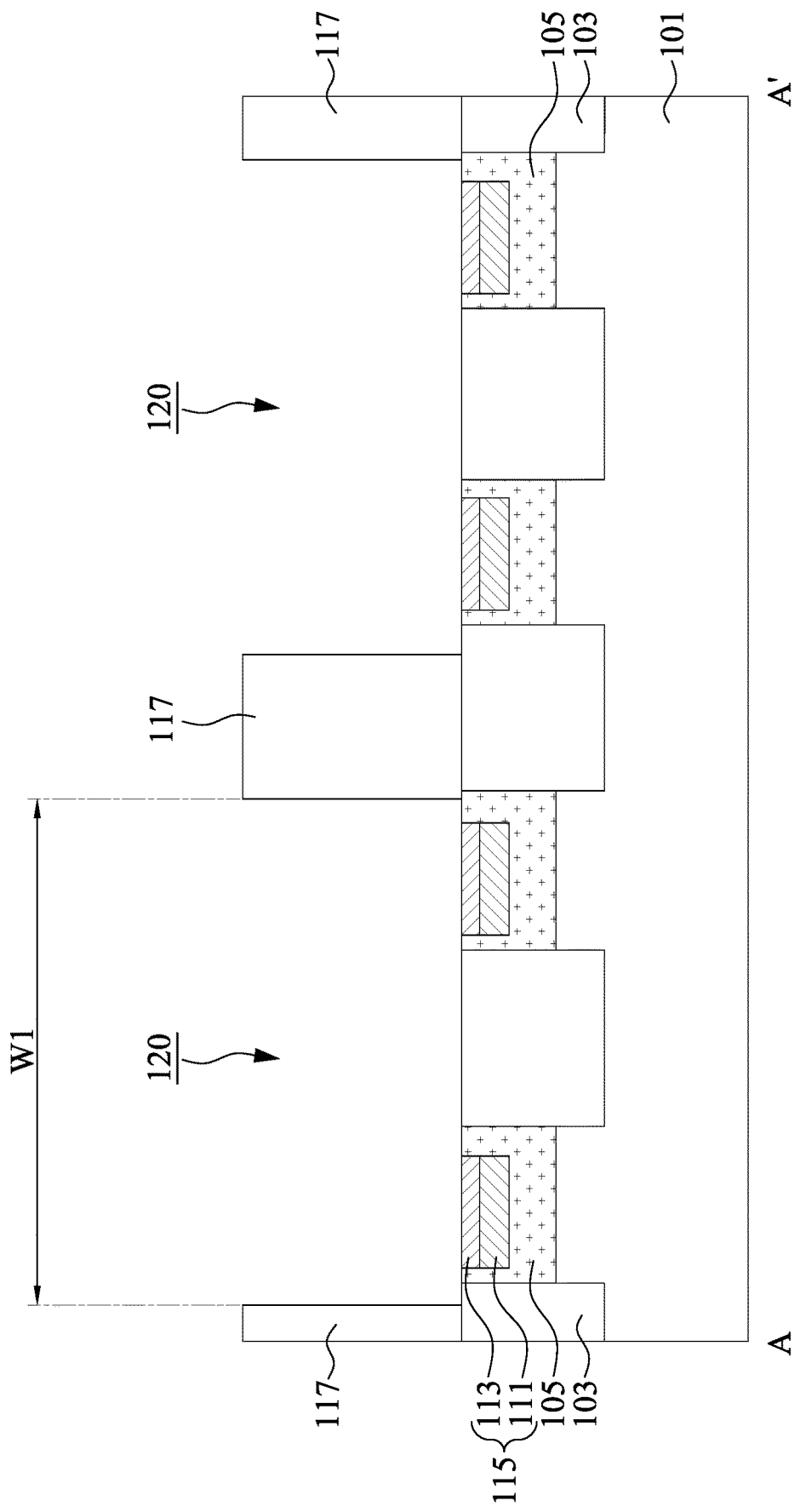
FIG. 9 is a cross-sectional view illustrating one of the intermediate stages in the formation of the semiconductor device along the sectional line A-A' in FIG. 8, in accordance with some embodiments.

FIG. 8 is a top view illustrating one of the intermediate stages in the formation of the semiconductor device 100, and FIG. 9 is a cross-sectional view illustrating one of the intermediate stages in the formation of the semiconductor device 100 along the sectional line A-A' in FIG. 8, in accordance with some embodiments.

After the bit line contacts 115 are formed, the dielectric structures 117 are formed over the top surface of the semiconductor substrate 101, as shown in FIGS. 8 and 9 in accordance with some embodiments. The respective step is illustrated as the step S15 in the method 10 shown in FIG. 3. In addition, the top surface of the semiconductor substrate 101 is partially exposed by a plurality of openings 120 between the dielectric structures 117.

In some embodiments, the dielectric structures 117 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the dielectric structures 117 are made of extreme low-k (ELK) dielectric materials with a dielectric constant less than about 2.5. In some embodiments, ELK dielectric materials include carbon doped silicon oxide, polytetrafluoroethylene (PTFE) (Teflon), silicon oxycarbide polymers (SiOC), hydrogen silsesquioxane (HSQ), methyl silsesquioxane (MSQ), polyarylether (PAE), SiLK™ (Dow Chemical, Midland, Michigan), Black Diamond™ (Applied Materials, Santa Clara, California), Cotal™ (Novellus System, San Jose, California), xeragel, aerogel porous polymer and/or other suitable materials.

In some embodiments, the dielectric structures 117 are formed by a deposition process, a patterning process and an etching process. First, a dielectric layer (not shown) may be formed over the top surface of the semiconductor substrate 101 by the deposition process. The deposition process may include a chemical vapor deposition (CVD) process, a physical vapor deposition (PVD) process, a spin coating process, or another applicable process. Next, during the subsequent patterning process, a patterned mask (not shown) may be formed over the dielectric layer, and the dielectric layer may be etched during the subsequent etching process using the patterned mask as a mask.

As a result, the dielectric structures 117 are obtained, and each of the openings 120 is formed between two adjacent dielectric structures 117. It should be noted that each of the openings 120 has a width W1, and the widths W1 of the openings 120 are wide enough to allow at least two of the bit line contacts 115 adjacent to the same word line 109 to be exposed by one of the openings 120.

Figure 10:
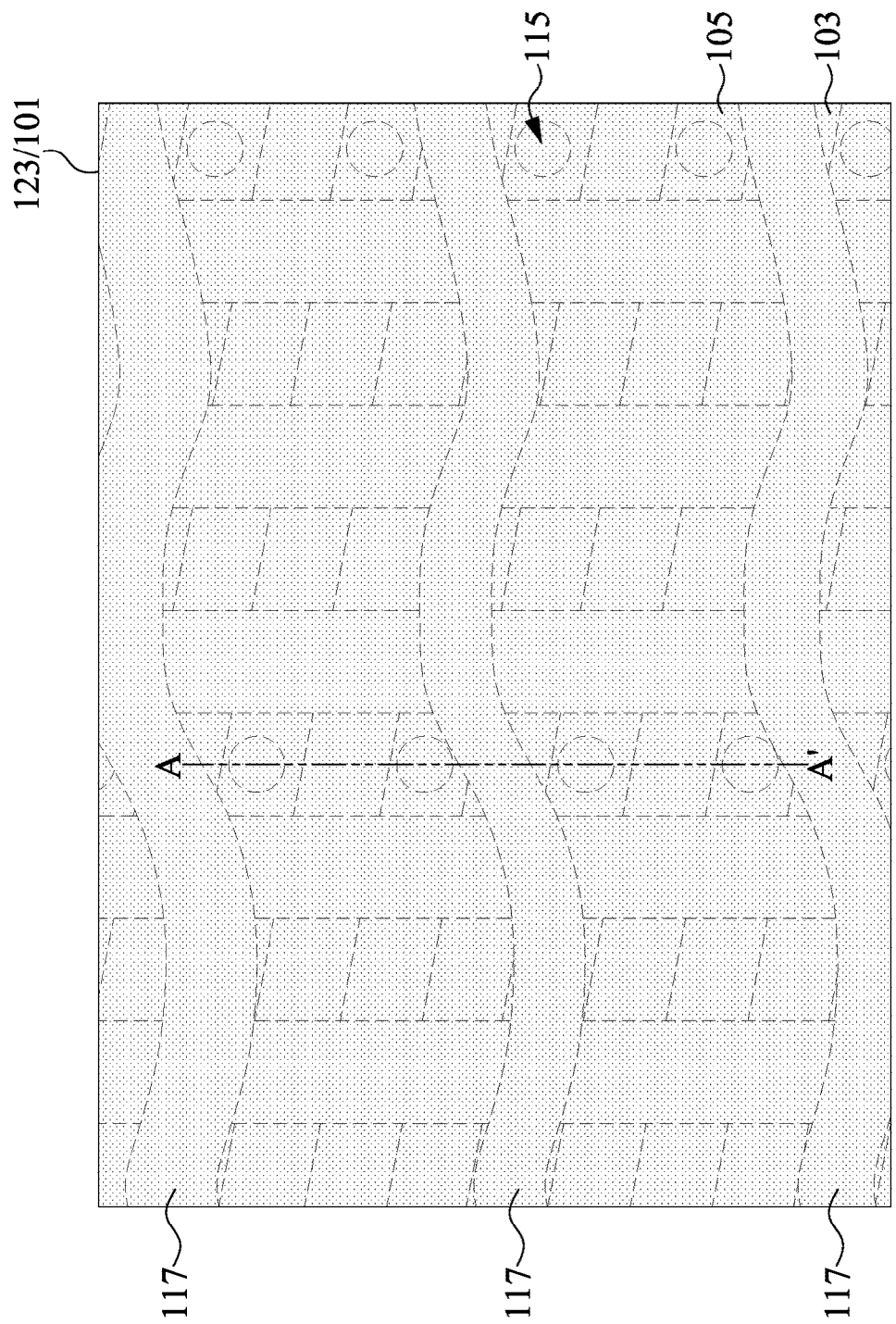
FIG. 10 is a top view illustrating one of the intermediate stages in the formation of a semiconductor device, in accordance with some embodiments.
Figure 11:
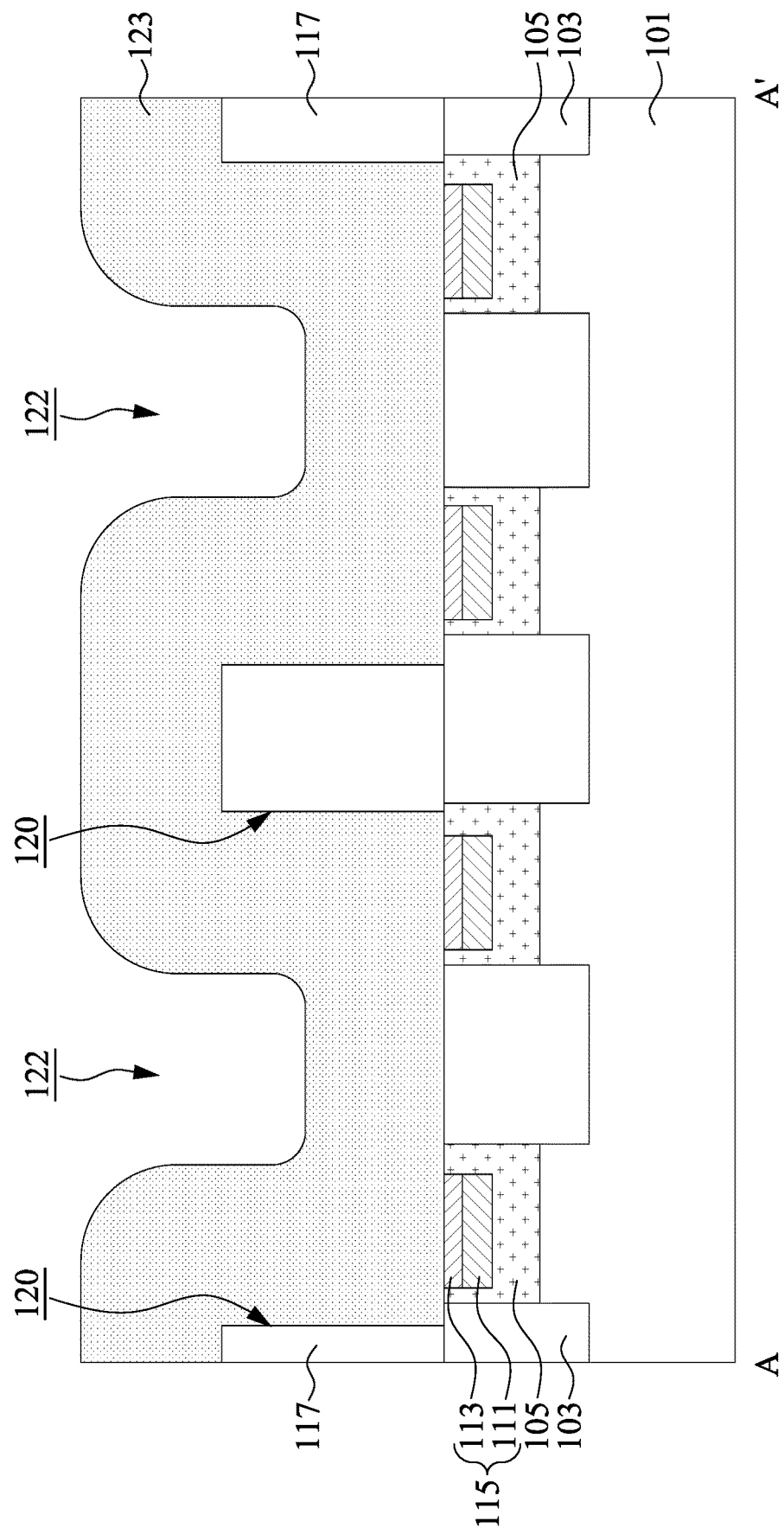
FIG. 11 is a cross-sectional view illustrating one of the intermediate stages in the formation of the semiconductor device along the sectional line A-A' in FIG. 10, in accordance with some embodiments.

FIG. 10 is a top view illustrating one of the intermediate stages in the formation of the semiconductor device 100, and FIG. 11 is a cross-sectional view illustrating one of the intermediate stages in the formation of the semiconductor device 100 along the sectional line A-A' in FIG. 10, in accordance with some embodiments.

After the dielectric structures 117 are formed, the conductive material 123 is formed over the dielectric structures 117, and the conductive material 123 extends into the openings 120, as shown in FIGS. 10 and 11 in accordance with some embodiments. The respective step is illustrated as the step S17 in the method 10 shown in FIG. 3. It should be noted that the portions of the top surface of the semiconductor substrate 101 exposed by the openings 120 are covered by the conductive material 123.

In some embodiments, the conductive material 123 is made of tungsten (W), aluminum (Al), copper (Cu), nickel (Ni), cobalt (Co), another conductive material, or a combination thereof. In some embodiments, the conductive material 123 is formed by a deposition process. The deposition process may include an electroplating process, a chemical vapor deposition (CVD) process, a physical vapor deposition (PVD) process, a spin coating process, an electroless plating process, or another applicable process.

In addition, since the conductive material 123 is conformally formed over the dielectric structures 117, recesses 122 are formed over and surrounded by the conductive material 123, in accordance with some embodiments. In some embodiments, the recesses 122 are formed between adjacent bit line contacts 115, and the bottom surfaces of the recesses 122 are higher than the top surface of the semiconductor substrate 101. Moreover, since the openings 120 are wide enough, the portions of the conductive material 123 filled in the openings 120 are formed without voids, thus improving the overall performance of the semiconductor device 100.

Figure 12:
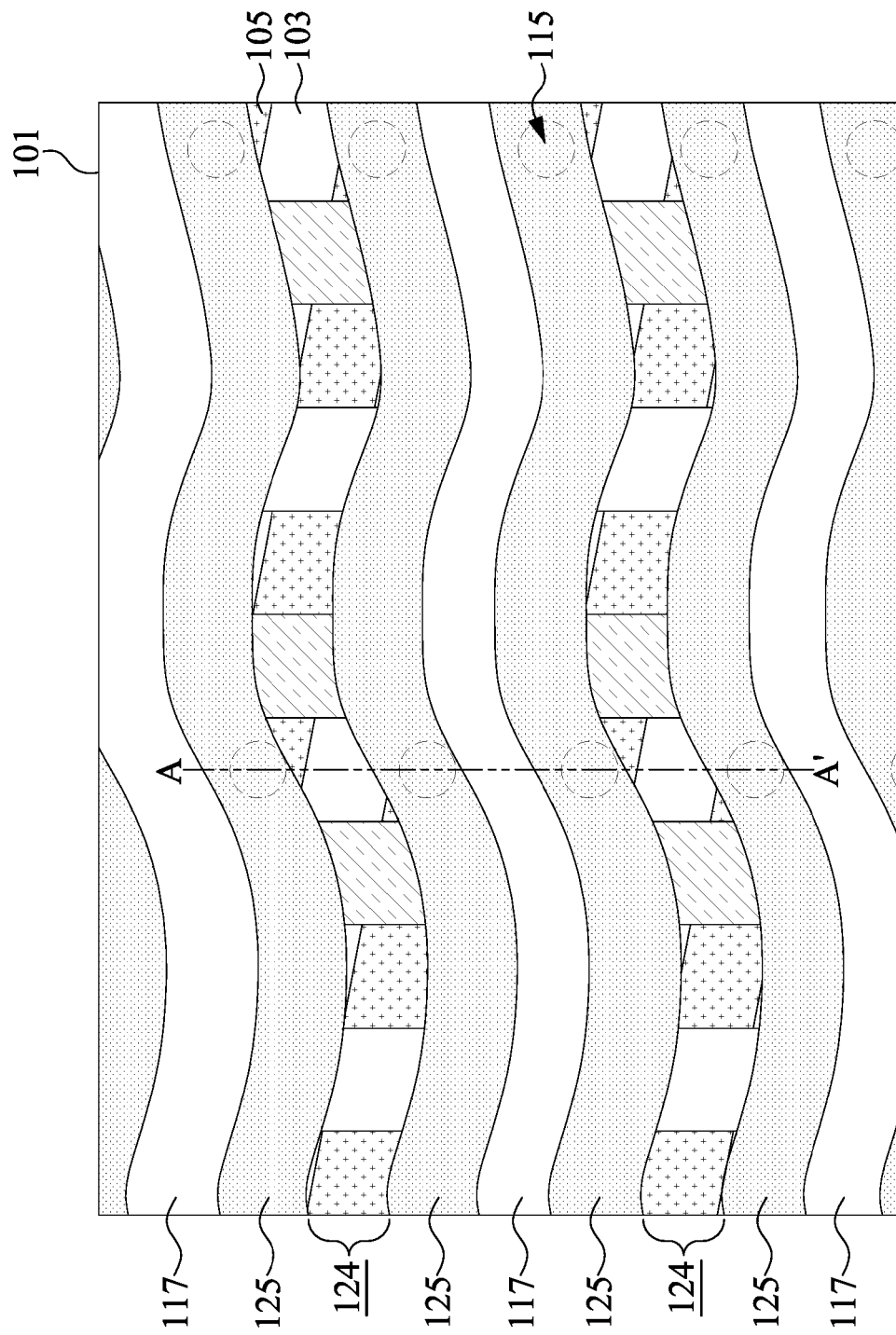
FIG. 12 is a top view illustrating one of the intermediate stages in the formation of a semiconductor device, in accordance with some embodiments.
Figure 13:
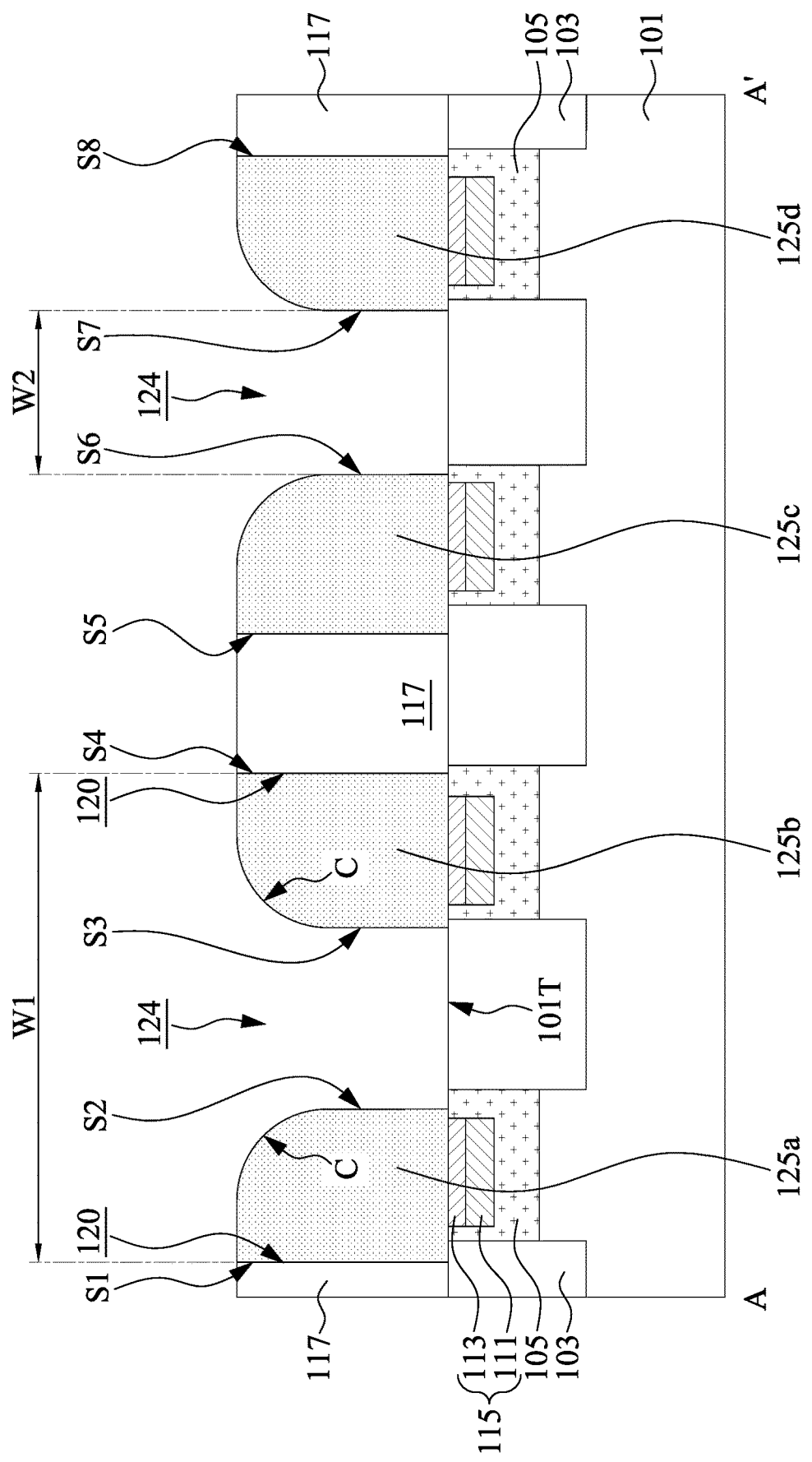
FIG. 13 is a cross-sectional view illustrating one of the intermediate stages in the formation of the semiconductor device along the sectional line A-A' in FIG. 12, in accordance with some embodiments.

FIG. 12 is a top view illustrating one of the intermediate stages in the formation of the semiconductor device 100, and FIG. 13 is a cross-sectional view illustrating one of the intermediate stages in the formation of the semiconductor device 100 along the sectional line A-A' in FIG. 12, in accordance with some embodiments.

After the conductive material 123 is formed, the conductive material 123 is partially removed to form the bit lines 125a, 125b, 125c and 125d in the openings 120, the bit lines 125a and 125b are separated from each other by an opening 124, and the bit lines 125c and 125d are separated from each other by another opening 124, as shown in FIGS. 12 and 13 in accordance with some embodiments. The respective step is illustrated as the step S19 in the method 10 shown in FIG. 3. It should be noted that each of the openings 124 has a width W2, and the width W1 of the openings 120 is greater than the width W2 of the openings 124.

In some embodiments, the conductive material 123 is partially removed by performing an etching process, and portions of the top surface 101T of the semiconductor substrate 101 are exposed by the openings 124 after the etching process is performed. In some embodiments, the etching process is an anisotropic etching process, which removes a similar amount of conductive material 123 vertically in all places, leaving the bit lines 125a, 125b, 125c and 125d along the sidewalls of the dielectric structures 117.

In some embodiments, the etching process includes a dry etching process, a wet etching process, or a combination thereof. It should be noted that the dielectric structures 117 may be used as supporters during the process for forming the bit lines 125a, 125b, 125c and 125d. Therefore, the bit lines 125a, 125b, 125c and 125d may be prevented from collapsing. This is especially critical for the bit lines 125a, 125b, 125c and 125d with high aspect ratios.

It should be noted that at least two of the bit lines 125a, 125b, 125c and 125d are formed in each opening 120, and the bit lines 125a, 125b, 125c and 125d are respectively electrically connected to the bit line contacts 115 exposed by the same opening 120 before the conductive material 123 is formed. Moreover, each of the bit lines 125a, 125b, 125c and 125d has a sidewall in direct contact with the dielectric structures 117 and an opposite sidewall exposed in the openings 124.

More specifically, the bit line 125a has a sidewall S1 and an opposite sidewall S2, the bit line 125b has a sidewall S3 and an opposite sidewall S4, the bit line 125c has a sidewall S5 and an opposite sidewall S6, and the bit line 125d has a sidewall S7 and an opposite sidewall S8. In some embodiments, the sidewalls S1, S4, S5 and S8 are in direct contact with the dielectric structures 117, and the sidewalls S2, S3, S6 and S7 are exposed in the openings 124.

In some embodiments, the top surfaces of the bit lines 125a, 125b, 125c and 125d are substantially level with the top surfaces of the dielectric structures 117. Within the context of this disclosure, the word "substantially" means preferably at least 90%, more preferably 95%, even more preferably 98%, and most preferably 99%. In some embodiments, the top portions of the bit lines 125a, 125b, 125c and 125d have rounded corners C adjacent to the openings 124.

Figure 14:
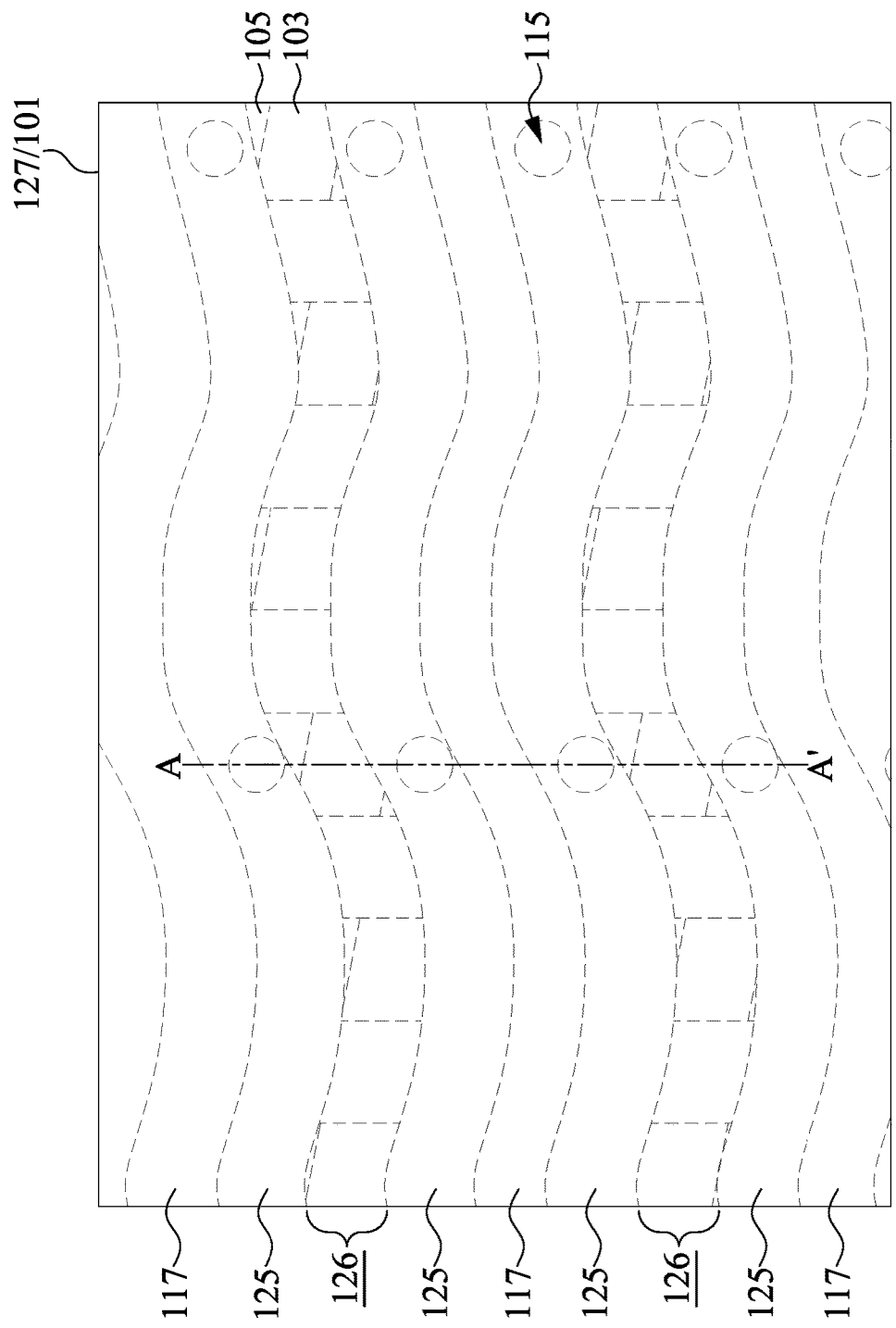
FIG. 14 is a top view illustrating one of the intermediate stages in the formation of a semiconductor device, in accordance with some embodiments.
Figure 15:
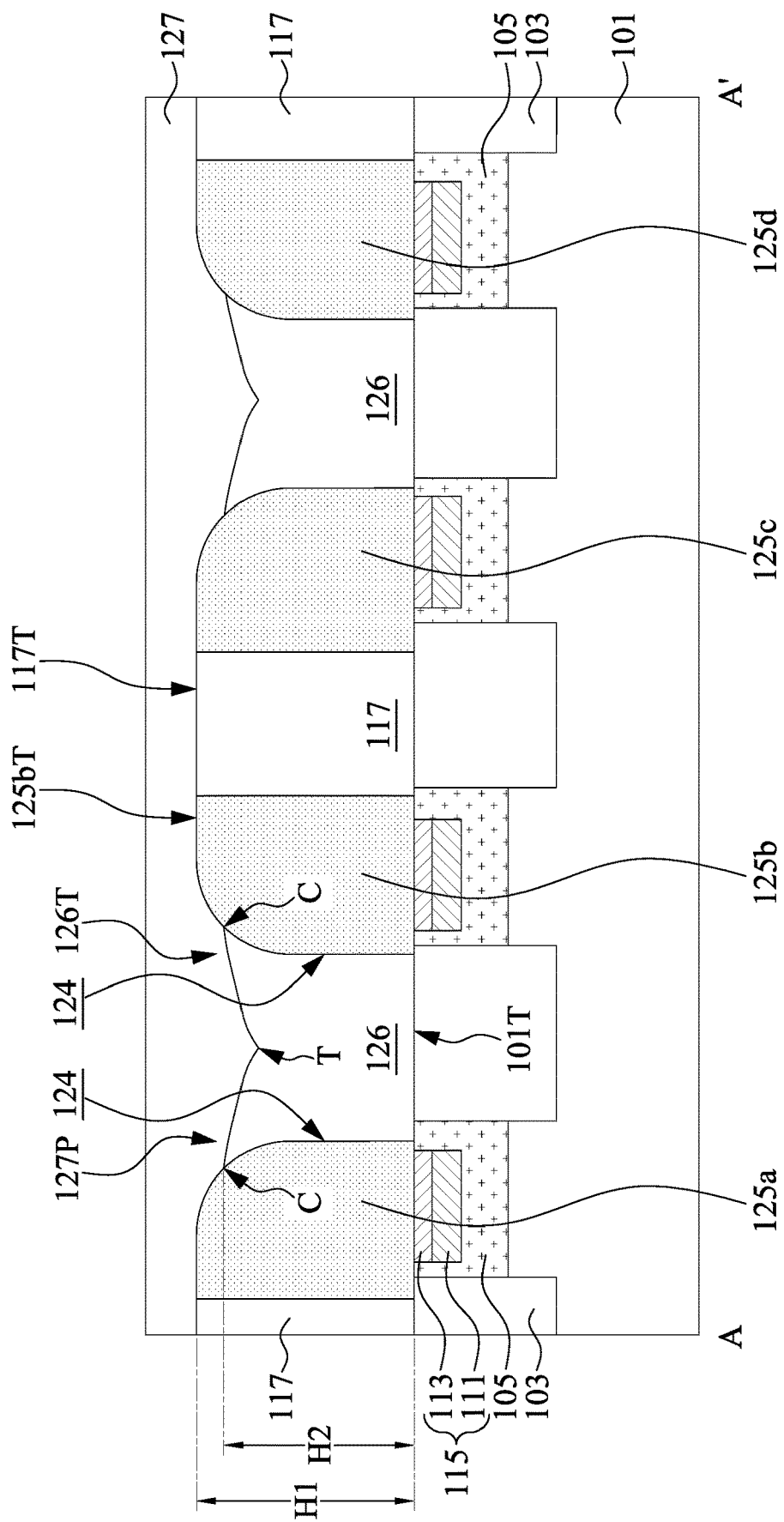
FIG. 15 is a cross-sectional view illustrating one of the intermediate stages in the formation of the semiconductor device along the sectional line A-A' in FIG. 14, in accordance with some embodiments.

After the openings 124 are formed, the sealing dielectric layer 127 is formed over the bit lines 125a, 125b, 125c and 125d such that air gaps 126 are formed between the sealing dielectric layer 127 and the top surface 101T of the semiconductor substrate 101, as shown in FIGS. 14 and 15 in accordance with some embodiments. The respective step is illustrated as the step S21 in the method 10 shown in FIG. 3. It should be noted that the sealing dielectric layer 127 extends into the top portions of the openings 124 to form the air gaps 126.

In some embodiments, the sealing dielectric layer 127 is made of silicon oxide, silicon nitride, silicon oxynitride, phosphosilicate glass (PSG), borophosphosilicate glass (BPSG), low-k dielectric material, and/or another applicable dielectric material. In some embodiments, the sealing dielectric layer 127 is formed by a chemical vapor deposition (CVD) process, a physical vapor deposition (PVD) process, an atomic layer deposition (ALD) process, a spin-coating process, or another applicable process.

In some embodiments, the sealing dielectric layer 127 is formed by a spin-coating process, and the openings 124 are easily sealed by the sealing dielectric layer 127 with the air gaps 126 formed therein rather than entirely filled up by the sealing dielectric layer 127. As a result, the air gaps 126 are enclosed by the sealing dielectric layer 127, the bit lines 125a, 125b, 125c, 125d, and the top surface 101T of the semiconductor substrate 101, as shown in FIG. 15 in accordance with some embodiments.

In some embodiments, the top surfaces of the bit lines 125a, 125b, 125c, 125d and the top surfaces of the dielectric structures 117 are higher than the top surfaces of the air gaps 126. For example, the top surface 125bT of the bit line 125b and the top surface 117T of the dielectric structures 117 are higher than the top surface 126T of the air gaps 126, as shown in FIG. 15. In some embodiments, the sealing dielectric layer 127 has protruding portions 127P sandwiched between the adjacent bit lines 125a, 125b, 125c, 125d, and the protruding portions 127P have tips T pointing toward the top surface 101T of the semiconductor substrate 101. In some embodiments, portions of the air gaps 126 extend between the sealing dielectric layer 127 and the rounded corners C of the bit lines 125a, 125b, 125c and 125d.

Moreover, in some embodiments, the heights of the interfaces between the bit lines 125a, 125b, 125c, 125d and the dielectric structures 117 are greater than the heights of the interfaces between the bit lines 125a, 125b, 125c, 125d and the air gaps 126 (i.e., the sidewall portions of the bit lines 125a, 125b, 125c, 125d are not covered by the sealing dielectric layer 127, and are exposed in the air gaps 126). For example, the interface between the bit line 125a and the dielectric structure 117 has a height H1, the interface between the bit line 125a and the air gap 126 has a height H2, and the height H1 is greater than the height H2, as shown in FIG. 15. The bit lines 125b, 125c and 125d have features similar to the above-mentioned feature of bit line 125a, and descriptions thereof are not repeated herein. In addition, some portions of the sealing dielectric layer 127 may drop into the openings 124 and partially cover the top surface of the semiconductor substrate 101.

After the sealing dielectric layer 127 is formed, a planarization process may be selectively performed. In some embodiments, the planarization process includes a grinding process, a chemical mechanical polishing (CMP) process, an etching process, another applicable process, or a combination thereof.

Next, the ILD structure 129 is formed over the sealing dielectric layer 127, and the capacitors 131 are formed in the ILD structure 129, as shown in FIGS. 1 and 2 in accordance with some embodiments. The respective step is illustrated as the step S23 in the method 10 shown in FIG. 3.

Some materials and processes used to form the ILD structure 129 are similar to, or the same as, those used to form the sealing dielectric layer 127, and descriptions thereof are not repeated herein. In some embodiments, the material of the ILD structure 129 is different from the material of the sealing dielectric layer 127 such that the etching selectivity of the ILD structure 129 with respect to the sealing dielectric layer 127 is high during the formation of the capacitors 131.

Moreover, the capacitors 131 are made of conductive material, such as poly-crystalline silicon, tungsten (W), copper (Cu), and some processes used to form the capacitors 131 are similar to, or the same as, those used to form the bit line contacts 115, and descriptions thereof are not repeated herein.

It should be noted that the capacitors 131 are electrically connected to the active regions 105 in the semiconductor substrate 101 by the capacitor contacts 133. In some embodiments, the capacitor contacts 133 penetrate through the dielectric structures 117. After the capacitors 131 are formed, the semiconductor device 100 is obtained. In the present embodiment, the semiconductor device 100 is a dynamic random access memory (DRAM).

In some embodiments, the dielectric structures 117 are disposed over the sidewall S1 of the bit line 125a, the sidewall S4 of the bit line 125b, the sidewall S5 of the bit line 125c and the sidewall S8 of the bit line 125d. The sidewall S2 of the bit line 125a and the sidewall S3 of the bit line 125b are separated by one of the air gaps 126, and the sidewall S6 of the bit line 125c and the sidewall S7 are separated by another air gap 126.

Embodiments of a semiconductor device and method for preparing the same are provided. The semiconductor device includes bit lines, dielectric structures and air gaps. Adjacent bit lines are alternately interposed by the air gaps and the dielectric structures. Therefore, parasitic capacitance between the bit lines may be reduced by the air gaps having low dielectric constant, and speeds of the semiconductor device may be increased.

Moreover, the dielectric structures are formed before the bit lines, and the dielectric structures are used as supporters during the process for forming the bit lines. Therefore, the bit lines may be prevented from collapsing. In addition, since the openings between two adjacent dielectric structures are wide enough, it is advantageous for the first bit line and the second bit line to be formed without voids. Accordingly, the overall performance of the semiconductor device may be improved.

Figure 16:
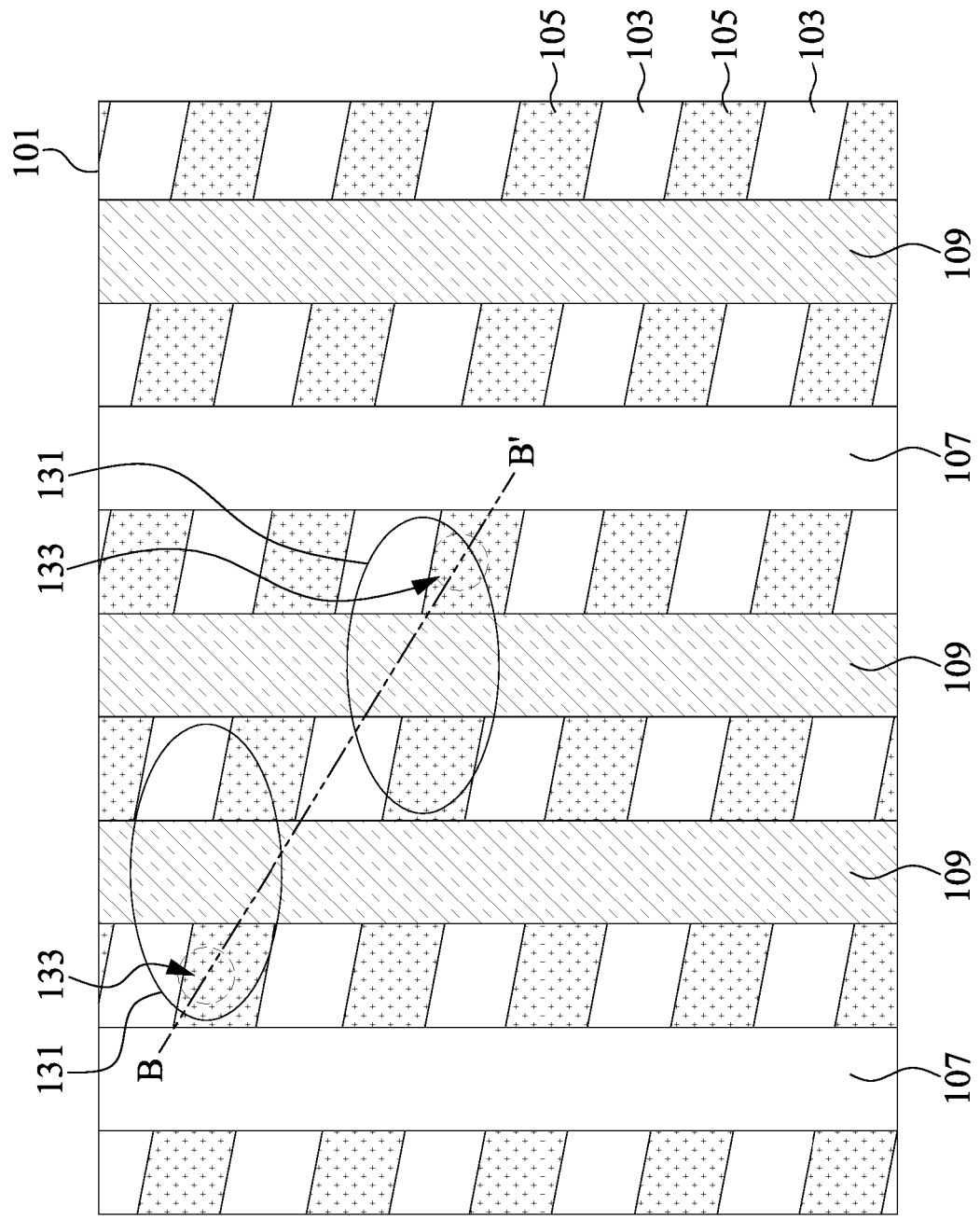
FIG. 16 is a top view illustrating the semiconductor device, in accordance with some embodiments.
Figure 17:
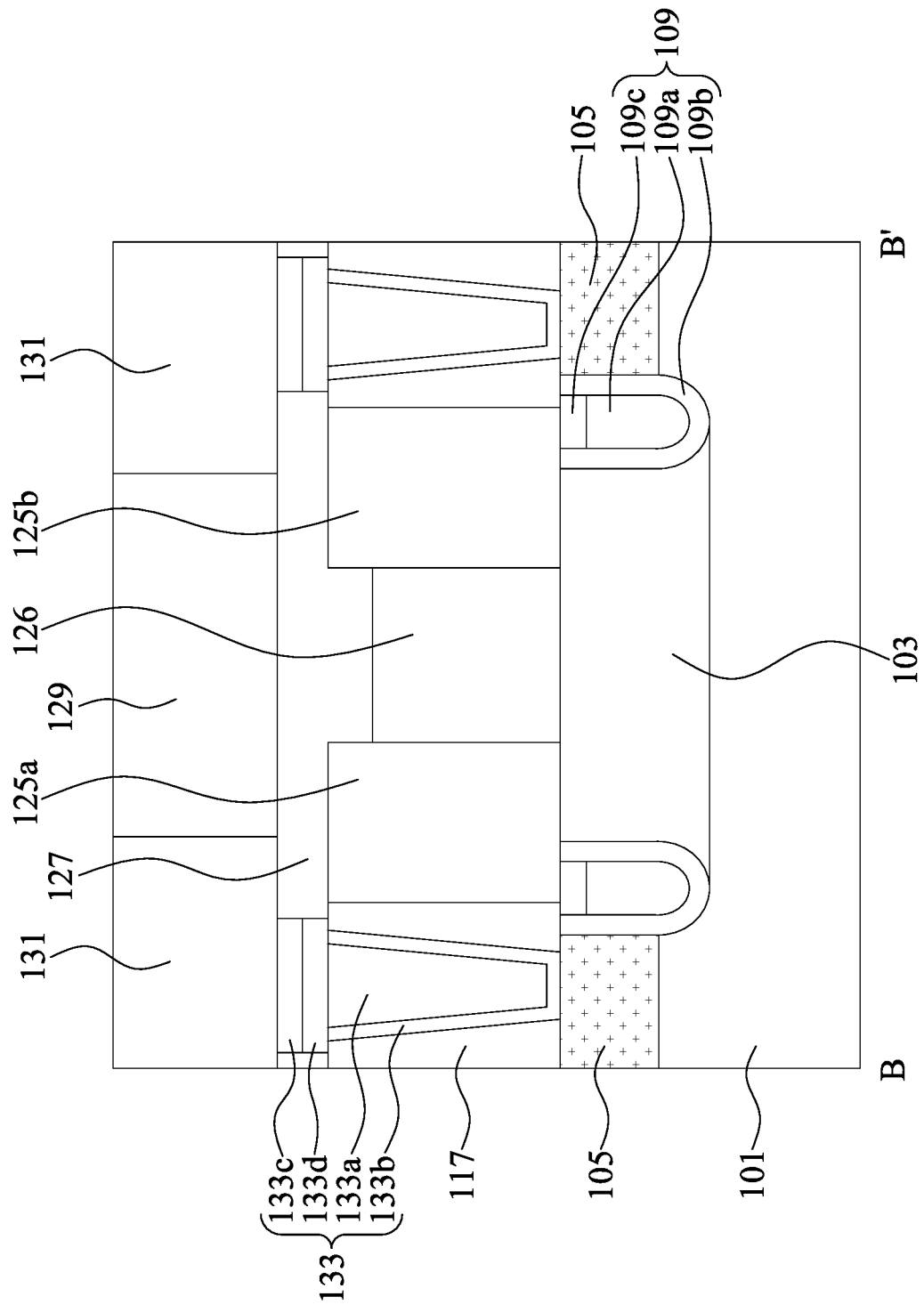
FIG. 17 is a cross-sectional view illustrating the semiconductor device along the sectional line B-B' in FIG. 16, in accordance with some embodiments.

Reference is made to FIG. 16 and FIG. 17. FIG. 16 is a top view illustrating the semiconductor device 100, in accordance with some embodiments. FIG. 17 is a cross-sectional view illustrating the semiconductor device 100 along a sectional line B-B' in FIG. 16, in accordance with some embodiments.

As shown in FIG. 16, the sectional line B-B' crosses two word lines 109 from one capacitor contact 133 to another capacitor contact 133 of respective capacitors 131.

As shown in FIG. 17, the word line 109 in formed in the substrate, which is a recess gate structure. The word line 109 is intersected with the active region 105. In some embodiments, the word line 109 include a buried gate electrode 109a, a gate dielectric layer 109b, and an insulating capping layer 109c.

In some embodiments, the gate dielectric layer 109b is formed of a dielectric material. For instance, the dielectric material may include silicon oxide or a high-k dielectric material having a dielectric constant greater than 3.9 (e.g., hafnium silicate, zirconium silicate, hafnium oxide, zirconium oxide or the like). In addition, in some embodiments, the word line 109 may be made of polysilicon, a metal material (e.g., tungsten) or a metal silicide (e.g., nickel silicide, platinum silicide, titanium silicide, molybdenum silicide, cobalt silicide, tantalum silicide, tungsten silicide or the like). Further, in some embodiments, the insulating capping layer 109c may be made of an insulating material, such as silicon oxide, silicon nitride, silicon oxynitride or the like.

The capacitor 131 is coupled to the active region 105 through the capacitor contact 133. In some embodiments, the capacitor contact 133 includes a conductive column 133a, a contact layer 133b, a landing pad 133c, and a conductive pillar 133d.

As illustrated in FIG. 17, the capacitor contacts 133 penetrates through the sealing dielectric layer 127 to the bottommost of the dielectric structure 117, to establish electrical contact with the active regions 105.

A bottom portion of the contact layer 133b is in contact with the active region 105, and sidewall portions of the contact layer 133b are in contact with the dielectric structure 117. A topmost surface of the contact layer 133b is coplanar with a top surface of the dielectric structure 117. The conductive column 133a is filled in a recess surrounded by the contact layer 133b, and a topmost surface of the conductive column 113a is coplanar with the top surface of the dielectric structure 117 and the topmost surface of the contact layer 133b. The conductive pillar 133d is formed over the conductive column 133a and the contact layer 133b. The landing pad 133c is formed over the conductive column 133d.

In some embodiments, the conductive pillar 133d is cover the topmost surface of the conductive column 133a, the topmost surface of the contact layer 133b, and a portion of the dielectric structure 117. In other words, a width of the conductive pillar 133d is wider than a width of the contact layer 133b at the topmost surface. In some embodiments, a width of the landing pad 133c is substantially equal to the width of the conductive pillar 133d. In other embodiments, the width of the landing pad 133c is different from the width of the conductive pillar 133d.

The capacitor 131 is formed over and in contact with the landing pad 133c. It should be noted that the width of the landing pad 133c is narrower than a width of the capacitor 131 in FIG. 17, however, the present disclosure is not limited thereto. In various embodiments, the width of the capacitor 131 is narrower than the width of the landing pad 133c.

In some embodiments, before the step S21 of the method 10 in FIG. 3 is performed, the capacitor contact 133 is formed.

Before the step S21 is performed, the dielectric structure 117 is patterned by a lithography process and etched by an etching process to form a recess for the contact layer 133b. Subsequently, the contact layer 133b is conformally formed in the recess by a deposition process (e.g., a CVD process), and the conductive column 133a is further filled in the recess by another deposition process (e.g., a CVD process) or a plating process. For instance, the plating process described in the present disclosure may include an electroplating process or an electro-less plating process. In addition, a planarization process may be performed to remove materials of the conductive columns 133a and the contact layer 133b outside the recess.

After the contact layer 133b and conductive column 133a are formed, a first conductive layer and a second conductive layer are globally formed on the current structure. In some embodiments, the first conductive layer has a thickness greater than a thickness of the second conductive layer. In addition, in some embodiments, a conductive material for forming the second conductive layer has a resistivity lower than a resistivity of the conductive material for forming the first conductive layer, and the conductive material for forming the first conductive layer has a sufficient etching selectivity with respect to the conductive material for forming the second conductive layer. A method for forming each of the first and second conductive layers may include a deposition process (e.g., a PVD process), a plating process or a combination thereof.

The first and second conductive layers are patterned to form the conductive pillar 133d and the landing pad 133c, respectively. During such patterning, portions of the first and second conductive layers are removed. Sidewalls of the conductive pillar 133d may be substantially coplanar with sidewalls of the formed landing pad 133c. In other words, a footprint area of each conductive pillar 133d may be substantially identical with a footprint area of the overlying landing pad 133c.

In some embodiments, a method for forming the conductive pillar 133d and the landing pad 133c may include a lithography process and a single etching process (e.g., a single anisotropic etching process). In these embodiments, the first and second conductive layers are partially removed in the same etching process. In alternative embodiments, a method for forming the conductive pillar 133d and the landing pad 133c uses two etching processes (e.g., two anisotropic etching processes). A first etching process is performed for forming the landing pad 133c, and a following second etching process is performed for forming the conductive pillar 133d, in which the first etching process is different form the second etching process.

After the capacitor contact 133 is formed, the step S21 is performed to form the sealing dielectric layer 129.

Figure 18:
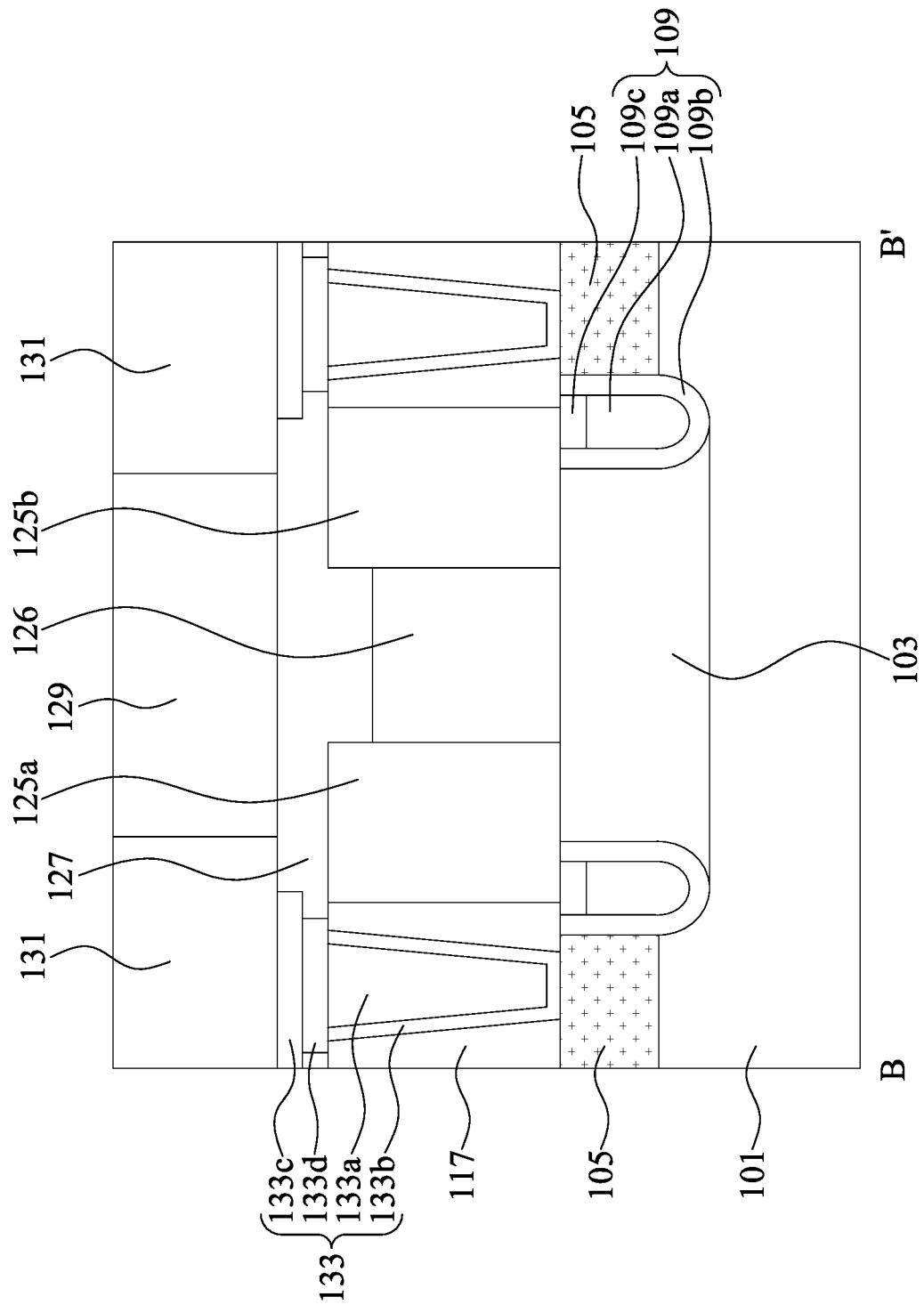
FIG. 18 is a cross-sectional view illustrating the semiconductor device along the sectional line B-B' in FIG. 16, in accordance with other embodiments.

Reference is made to FIG. 18. FIG. 18 is a cross-sectional view illustrating the semiconductor device 100 along a sectional line B-B' in FIG. 16, in accordance with other embodiments.

Compared to the cross-section view in FIG. 17, the cross-section view in FIG. 18 has a conductive pillar 133d which has a narrower width than the landing pad 133c.

In some embodiments, a method for forming the conductive pillar 133d and the landing pad 133c shown FIG. 18 may include a lithography process, an anisotropic etching process, and an isotropic etching process. In these embodiments, the first and second conductive layers are partially removed in the anisotropic etching process. After the anisotropic etching process, a laterally recessing process is performed to recessing the sidewall of the conductive pillar 133d, so as to decrease the width of the conductive pillar 133d. In some embodiments, the laterally recessing process is an isotropic etching process (e.g., a wet etching process). In those embodiments where the conductive material for forming the landing pad 133c has a sufficient etching selectivity with respect to the conductive material for forming the conductive pillar 133d, the landing pad 133c may avoid from being damaged (or may be slightly consumed) during such isotropic etching process. As a consequence, the formed conductive pillar 133d can be laterally recessed with respect to the landing pad 133c.

In one embodiment of the present disclosure, a method for preparing a semiconductor device is provided. The method includes: forming a first dielectric structure and a second dielectric structure over a semiconductor substrate; forming a conductive material over the first dielectric structure and the second dielectric structure, wherein the conductive material extends into a first opening between the first dielectric structure and the second dielectric structure; partially removing the conductive material to form a first bit line and a second bit line in the first opening; forming a first capacitor contact and a second capacitor contact in the first dielectric structure and the second dielectric structure, respectively; forming a sealing dielectric layer over the first bit line and the second bit line such that an air gap is formed between the sealing dielectric layer and the semiconductor substrate; and forming a first capacitor and a second capacitor over the first capacitor contact and the second capacitor contact, respectively.

In another embodiment of the present disclosure, a semiconductor device is provided. The semiconductor device includes a first bit line, a dielectric structure, a second bit line, a sealing dielectric layer, a capacitor contact, and a capacitor. The first bit line is disposed over a semiconductor substrate. The dielectric structure is disposed over a sidewall of the first bit line. The second bit line is disposed over the semiconductor substrate. The first bit line is between the second bit line and the dielectric structure, and the first bit line is separated from the second bit line by an air gap. The sealing dielectric layer is disposed over the first bit line, the second bit line, the dielectric structure and the air gap. The capacitor contact is disposed in the dielectric structure and the sealing dielectric layer. The capacitor is coupled to the capacitor contact.

Although the present disclosure and its advantages have been described in detail, it should be understood that various changes, substitutions and alterations can be made herein without departing from the spirit and scope of the disclosure as defined by the appended claims.

For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a first bit line disposed over a semiconductor substrate;
    a dielectric structure in contact with a sidewall of the first bit line;
    a second bit line disposed over the semiconductor substrate,5 wherein the first bit line is between the second bit line and the dielectric structure, and the first bit line is separated from the second bit line by an air gap;
    a sealing dielectric layer disposed over the first bit line, the second bit line, the dielectric structure and the air gap;
    a capacitor contact disposed in the dielectric structure and the sealing dielectric layer; and
    a capacitor, coupled to the capacitor contact.

2. The semiconductor device of claim 1, wherein a top portion of the first bit line has a rounded corner, and a portion of the air gap extends between the sealing dielectric layer and the rounded corner of the first bit line.

3. The semiconductor device of claim 1, wherein the capacitor contact comprises:
    a contact layer disposed in the dielectric structure;
    a conductive column disposed in the dielectric structure, wherein the contact layer is disposed between the dielectric structure and the conductive column;
    a conductive pillar disposed over the contact layer and the conductive column; and
    a landing pad disposed between the conductive pillar and the capacitor.

4. The semiconductor device of claim 3, wherein a width of the capacitor is wider than a width of the landing pad.

5. The semiconductor device of claim 3, wherein a width of the conductive pillar is narrower than a width of the landing pad.

6. The semiconductor device of claim 3, wherein a width of the conductive pillar is substantially equal to a width of the landing pad.

7. The semiconductor device of claim 3, wherein a width of the conductive pillar is wider than a width of a topmost surface of the contact layer.

8. The semiconductor device of claim 1, wherein the dielectric structure is in direct contact with the sidewall of the first bit line.

9. The semiconductor device of claim 1, wherein a top surface of the first bit line is higher than a top surface of the air gap.

10. The semiconductor device of claim 1, wherein a top surface of the dielectric structure is higher than the top surface of the air gap.

11. The semiconductor device of claim 1, further comprising:
    a plurality of active regions defined by a plurality of isolation structures in the semiconductor substrate.

12. The semiconductor device of claim 11, further comprising:
    a first bit line contact and a second bit line contact disposed in the active regions, wherein the first bit line is electrically connected to one of the active region by the first bit line contact, and the second bit line is electrically connected to an another active region by the second bit line contact.

13. The semiconductor device of claim 12, wherein the first bit line contact comprises a conductive layer and a metal silicide layer over the conductive layer.

14. The semiconductor device of claim 1, further comprising:
a word line disposed in the semiconductor substrate, wherein the word line is insulated from the first bit line and the second bit line.

15. The semiconductor device of claim 14, wherein the word line is intersected with a plurality of active regions and a plurality of isolation structures.

16. The semiconductor device of claim 14, wherein the word line comprises:
a buried gate electrode;
a gate dielectric layer disposed between the active region and the buried gate electrode; and
an insulating capping layer disposed over the gate dielectric layer.

17. The semiconductor device of claim 1, wherein the sealing dielectric layer has a protruding portion sandwiched between the first bit line and the second bit line.

18. The semiconductor device of claim 17, wherein the protruding portion of the sealing dielectric layer has a tip pointing toward the semiconductor substrate.

19. The semiconductor device of claim 1, wherein an interface between the first bit line and the dielectric structure has a first height, an interface between the first bit line and the air gap has a second height, and the first height is greater than the second height.

* * * * *